United States Patent [19]

Tsutsumi

[11] Patent Number: 5,550,396

[45] Date of Patent: Aug. 27, 1996

[54] VERTICAL FIELD EFFECT TRANSISTOR WITH A TRENCH STRUCTURE

[75] Inventor: Kazuhito Tsutsumi, Hyogo-ken, Japan

[73] Assignee: Mitsubishi Denki Kabushiki Kaisha, Tokyo, Japan

[21] Appl. No.: 449,611

[22] Filed: May 24, 1995

Related U.S. Application Data

[63] Continuation of Ser. No. 171,258, Dec. 21, 1993, abandoned, which is a continuation of Ser. No. 980,878, Nov. 24, 1992, abandoned.

[30] Foreign Application Priority Data

Jan. 24, 1992 [JP] Japan .................................. 4-011412

[51] Int. Cl.[6] .......................... H01L 29/76; H01L 29/94; H01L 31/062
[52] U.S. Cl. ........................... 257/330; 257/334; 257/382
[58] Field of Search ..................... 257/330, 296, 257/302, 622, 623, 347, 348, 68, 301, 911, 382, 754, 369, 296, 903

[56] References Cited

U.S. PATENT DOCUMENTS

| | | | |
|---|---|---|---|
| 4,131,907 | 12/1978 | Ouyang | 257/369 |
| 4,322,453 | 3/1982 | Miller | 257/754 |
| 4,686,552 | 8/1987 | Teng et al. | 257/68 |
| 4,835,584 | 5/1989 | Lancaster | 257/330 |
| 4,890,144 | 12/1989 | Teng et al. | 257/903 |
| 4,951,102 | 8/1990 | Beitman et al. | 257/374 |
| 4,996,574 | 2/1991 | Shirasaki | 257/347 |
| 5,225,701 | 7/1993 | Shimizu et al. | 257/369 |

FOREIGN PATENT DOCUMENTS

| | | |
|---|---|---|
| 0363670 | 4/1990 | European Pat. Off. . |
| 60-136369 | 11/1985 | Japan . |
| 880204 | 2/1986 | Japan . |
| 62-272561 | 11/1987 | Japan . |
| 0015467 | 1/1988 | Japan ..................................... 257/330 |
| 63-224365 | 1/1989 | Japan . |
| 2249277 | 10/1990 | Japan ..................................... 257/330 |
| 4014878 | 4/1992 | Japan . |

OTHER PUBLICATIONS

Walsh; "Choosing and Using CMOS"; 1986; pp. 112–115, McGraw–Hill, N.Y.

R. Eklung et al., "A 0.5μmBiCMOS Technology for Logic and 4Mbit-class SRAM's", Semiconductor Process and Design Center, 16.4.1–16.4.4, IEDM 89–425–IEDM 89–428, CH2637–7/89/0000–0425, 1989 IEEE.

"An 8nm-thick Polysilicon MOS Transistor and Its Thin Film Effects", by T. Hashimoto et al., Extended Abstracts of the 21st Conference on Solid State Devices and Materials, Tokyo, 1989, pp. 97–100.

"A 25 μm² New Poly-Si PMOS Load (PPL) SRAM Cell Having Excellent Soft Error Immunity", by T. Yamanaka et al., 1988 IEEE, pp. 48–51.

"A 0.5 μm BiCMOS Technology for Logic and 4Mbiy-class SRAM's", by R. Eklund et al., 1989 IEEE, pp. 425–428.

*Primary Examiner*—Wael M. Fahmy
*Attorney, Agent, or Firm*—Lowe, Price, LeBlanc & Becker

[57] ABSTRACT

A polycrystalline silicon film which is to be a channel is in a trench provided in a main surface of a silicon substrate. A gate insulating film is on the periphery of a polycrystalline silicon film. A gate electrode is on the periphery of the gate insulating film. A silicon oxide film is on the periphery of the gate electrode. A source/drain film is on the periphery of the silicon oxide film. A silicon oxide film is on the periphery of the source/drain film. A source/drain film is electrically connected to the polycrystalline silicon film. A source/drain film is electrically connected to the polycrystalline silicon film. Since the polycrystalline silicon film extends along the depth direction of trench, a channel length can be sufficient to prevent a short channel effect. Also, compared to the case in which an epitaxial layer is used as a channel, since the polycrystalline silicon film is used as a channel, the time required for manufacturing the device can be shortened.

21 Claims, 25 Drawing Sheets

VERTICAL FIELD EFFECT TRANSISTOR WITH A TRENCH STRUCTURE

This aplication is a continuation of application Ser. No. 08/171,258 now abandoned filed Dec. 21, 1993, which is a continuation of application Ser. No. 07/980,878 now abandoned filed Nov. 24, 1992.

BACKGROUND OF THE INVENTION

1. Field of the Invention

The present invention relates to field effect transistors and, more particularly, to a field effect transistor used in a Static Random Access Memory (hereinafter referred to as "SRAM") and a manufacturing method thereof.

2. Description of the Background Art

A SRAM is a RAM in which information is stored as long as voltage is supplied. Compared to a DRAM (Dynamic Random Access Memory), the SRAM does not need a refresh circuit and is excellent at a high speed operation. FIG. 36 is a schematic diagram of an equivalent circuit of the SRAM. An inverter 1 and an inverter 3 constitute a flipflop circuit. An access transistor 5 has one of source and drain connected to the flipflop circuit at a connection portion B, and the other of source and drain connected to a BL. An access transistor 7 has one of source and drain connected to the flipflop circuit at a connection portion A, and the other of source and drain connected to a /BL. A memory cell is formed of inverters 1, 3 and access transistors 5, 7. A WL is connected to the gates of access transistors 5, 7.

Writing operation for storing a state of "H" will be described. First, BL is set in an "H" state, and /BL is set in an "L" state. A voltage is applied to WL, so that access transistors 5, 7 are turned on. Since BL is in an "H" state, connection portion B is also in an "H" state. Also, since /BL is in an "L" state, connection portion A is in an "L" state. The voltage applied to WL is then removed so that access transistors 5, 7 are turned off. Connection portion B is in an "H" state and therefore connection portion A is brought into an "L" state through inverter 3. Also, connection portion A is in an "L" state and therefore connection portion B is brought into an "H" state through inverter 1. Thus, connection portion B is held in an "H" state, and connection portion A is held in an "L" state.

Next, reading operation will be described. A voltage is applied to WL so that access transistors 5, 7 are turned on. Since connection portion B is in an "H" state, BL is brought into an "H" state. Since connection portion A is in an "L" state, /BL is brought into an "L" state. However, the difference between the voltage of an "H" state and the voltage of an "L" state is not so large. A sense amplifier compares the voltage of BL and the voltage of /BL in order that determination is made without fail that BL is in an "H" state. As a result, determination is made that the voltage of BL is larger than the voltage of /BL. Since the voltage of BL is larger than the voltage of /BL, BL should be in an "H" state. Therefore, it can be seen that "H" is stored in this memory circuit.

The inverters will be described. FIG. 37 is a schematic diagram of an equivalent circuit of inverter 1. 9 denotes a PMOS transistor and 11 an NMOS transistor. When $V_{in}$ is in an "H" state, PMOS transistor 9 is held off, NMOS transistor 11 is held on, and $V_{out}$ is in an "L" state. Conversely, when $V_{in}$ is in an "L" state, PMOS transistor 9 is held on, NMOS transistor 11 is held off, and $V_{out}$ is in an "H" state.

FIG. 38 is a schematic diagram of an equivalent circuit when an output of inverter 1 is connected to an input of inverter 3 and an input of inverter 1 is connected to an output of inverter 3. The circuit forms a flipflop circuit. Inverter 3 includes a PMOS transistor 13 and an NMOS transistor 15. 25 denotes a gate electrode of PMOS transistor 13. 21 denotes a gate electrode of access transistor 7. 17 denotes a gate electrode of NMOS transistor 11.

As can be seen from FIG. 38, a memory cell of the SRAM comprises two PMOS transistors and four NMOS transistors. If all these transistors are formed on the same plane, that is, the main surface of a silicon substrate, an integration density decreases. Therefore, the PMOS transistors are located above the NMOS transistors.

FIG. 39 is a sectional view of a memory cell of the SRAM. The same reference characters as those in FIG. 38 denote the same portions. Access transistor 7 and NMOS transistor 11 are formed on a main surface 24 of a silicon substrate 22. Access transistor 7 includes a gate electrode 21 and source/drain regions 19, 23 in silicon substrate 22 with a space therebetween. 17 denotes a gate electrode of NMOS transistor 11. A source/drain of NMOS transistor 11 is not shown in this figure. 35 denotes a field oxide film.

An interlayer insulating film 33 is formed on gate electrode 17. A gate electrode 25 is formed on interlayer insulating film 33. A polycrystalline silicon film 31 is formed to cover gate electrode 25. A portion of polycrystalline silicon film 31 facing gate electrode 25 is a channel region 28. A channel region 28 is interposed between source/drain regions 27, 29 in polycrystalline silicon film 31. Polycrystalline silicon film 31 and gate electrode 17 are electrically connected to a source/drain region 19.

FIG. 40 is a plan view of PMOS transistor 13 shown in FIG. 39. 25 denotes the gate electrode, and 27, 29 denote source/drain regions. A method of manufacturing PMOS transistor 13 shown in FIG. 39 will be described. The same reference characters as those in FIG. 38 denote the same portions. As shown in FIG. 41, a polycrystalline silicon film is formed on interlayer insulating film 33 using a low pressure CVD (Chemical Vapor Deposition) method. The polycrystalline silicon film is patterned to form gate electrode 25 using photolithography and etching.

As shown in FIG. 43, a gate insulating film 37 is formed on gate electrode 25 using the low pressure CVD method. A polycrystalline silicon film 31 is formed on gate insulating film 37 using the low pressure CVD method.

As shown in FIG. 43, a resist 39 is formed on polycrystalline silicon film 31. Resist 39 is subjected to predetermined patterning. $BF_2$ is implanted into polycrystalline silicon film 31 using resist 39 as a mask.

As shown in FIG. 44, resist 39 is removed. Boron of $BF_2$ is properly diffused in polycrystalline silicon film 31 through heat treatment, so that source/drain regions 27, 29 are formed. 28 denotes the channel region.

$L_1+L_2+L_3$ is a channel length. Channel lengths tend to become shorter as integration density of an SRAM increases. If a channel length is short, a short channel effect which causes deterioration of characteristics of a field effect transistor is produced.

A field effect transistor shown in FIG. 45 was devised in order to solve the problem. The field effect transistor is disclosed in "A 0.5 μm BiCMOS Technology for Logic and 4M bit-class SRAM's", pp. 425–428, IDEM 89.

A gate electrode 47 of a transistor 44 is embedded in trench 41 formed in a semiconductor substrate 40 and an epitaxial layer 42. A source/drain region 43 is formed in epitaxial layer 42. Source/drain region 45 which is an N+ embedded layer is formed in silicon substrate 40. Field effect transistor 44 has a channel region formed in the depth direction of trench 41. L indicates a channel length. Gate length L can be sufficient to prevent a short channel effect in field effect transistor 44 if the thickness of epitaxial layer 42 is increased.

Transistor 44 shown in FIG. 45 is manufactured by forming source/drain region 45 in semiconductor substrate 40, subsequently forming epitaxial layer 42 on semiconductor substrate 40, and forming trench 41 in epitaxial layer 42.

Forming an epitaxial layer takes time, and time required for manufacturing transistor 44 increases.

SUMMARY OF THE INVENTION

The invention is thus made to solve the conventional problem. An object of the invention is to provide a field effect transistor which can be manufactured in a shorter period of time and has a structure in which a short channel effect can be prevented.

Another object of the invention is to provide a field effect transistor having a structure in which prevention of a short channel effect can be further enhanced.

Another object of the invention is to provide a method of manufacturing a field effect transistor which can be manufactured in a shorter period of time and has a structure in which a short channel effect can be prevented.

The invention relates to a field effect transistor formed in a hole portion provided in a main surface of a semiconductor substrate. The field effect transistor according to the present invention includes a first end portion on the side of the main surface, a second end portion on the side of a bottom portion of the hole portion, and a first polycrystalline silicon film serving as a channel. The first polycrystalline silicon film is in the hole portion and extends along the depth direction of the hole portion. The field effect transistor according to the invention further includes a gate electrode located in the hole portion, extending along the depth direction of the hole portion, and facing the first polycrystalline silicon film with a gate insulating film interposed therebetween. The field effect transistor according to the invention further includes a first source/drain film electrically connected to the second end portion of the first polycrystalline silicon film. The first source/drain film is located on the periphery of said first polycrystalline silicon film and the gate electrode and extending along the depth direction in the hole portion. The field effect transistor according to the invention further includes a first insulating film in the hole portion electrically insulating the first source/drain film from the gate electrode, a second insulating film in the hole portion electrically insulating the first source/drain film from the semiconductor substrate, and the second source/drain film on the main surface electrically connected to the first end portion of the first polycrystalline silicon. A method of manufacturing a field effect transistor according to the invention includes the steps of forming a hole portion in a main surface of a semiconductor substrate; forming a first insulating film, a first polycrystalline silicon film which is to be a first source/drain, a second insulating film and a second polycrystalline silicon film on a side surface and a bottom surface of the hole portion, in order, such that the hole portion is not completely filled; forming resist on the second polycrystalline silicon film and subjecting the resist to predetermined patterning; etching the second polycrystalline silicon film using the resist as a mask to form a gate electrode and expose the second insulating film on the bottom surface; etching the exposed second insulating film using the resist as a mask to expose the first polycrystalline silicon film under the exposed second insulating film; forming a gate insulating film in a space formed by the gate electrode and the first polycrystalline silicon film such that the hole portion is not completely filled; removing the gate insulating film on the bottom surface to expose the first polycrystalline silicon film; forming a third polycrystalline silicon film which is to be a channel to fill a space formed by the gate insulating film and the exposed first polycrystalline silicon film; and forming a fourth polycrystalline silicon film which is to be a second source/drain electrically connected to the third polycrystalline silicon film on the main surface.

The first polycrystalline silicon film which is to be a channel is formed in the hole portion provided in the main surface of the semiconductor substrate. Since the first polycrystalline silicon film extends along the depth direction of the hole portion, the channel length can be sufficient to prevent a short channel effect.

Since the first polycrystalline silicon film serves as a channel, the channel can be formed using the CVD method and the like. Therefore, compared to the case in which an epitaxial layer is used for a channel, the device can be manufactured in a shorter period of time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A First Embodiment

Figure 1:
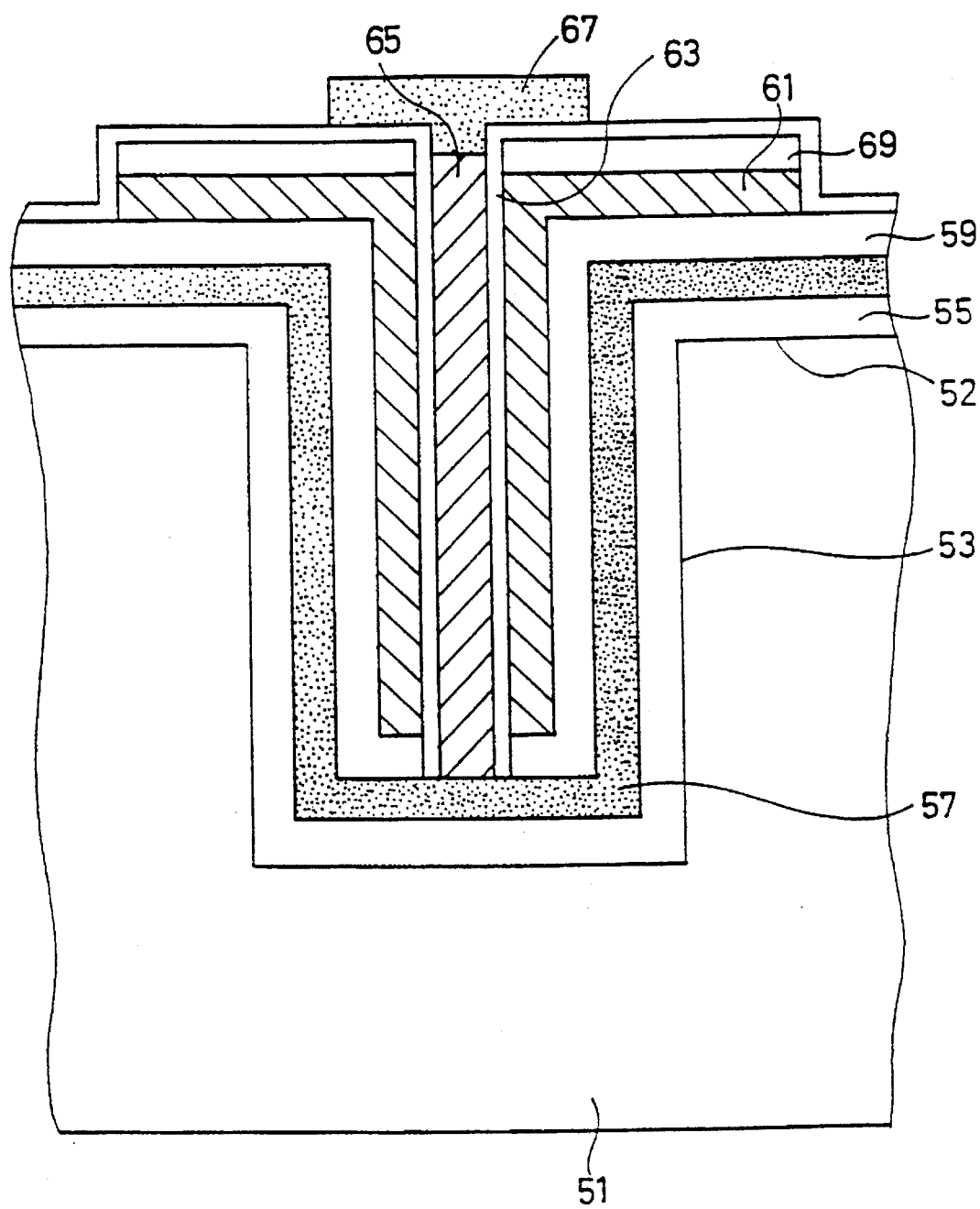
FIG. 1 is a sectional view of a field effect transistor of a first embodiment according to the invention.

FIG. 1 is a sectional view of a first embodiment of a field effect transistor according to the invention. Trench 53 is formed in a main surface 52 of a silicon substrate 51. A polycrystalline silicon film 65 which is to be a channel is formed in trench 53. Polycrystalline silicon film 65 which is to be a channel is located in trench 53 and extends along the depth direction of trench 53.

A gate insulating film 63 is formed on the periphery of polycrystalline silicon film 65 in trench 53. A gate electrode 61 is formed on the periphery of gate insulating film 63 in trench 53.

A silicon oxide film 59 is formed on the periphery of gate electrode 61 in trench 53. Source/drain film 57 is formed on the periphery of silicon oxide film 59 in trench 53. Source/drain film 57 is electrically connected to polycrystalline silicon film 65. Source/drain film 57 is to be a source/drain.

A silicon oxide film 55 is formed on the periphery of source/drain film 57 in trench 53. Source/drain film 67 is above main surface 52 and electrically connected to polycrystalline silicon film 65. In this embodiment, the channel is surrounded by the gate electrode; however, a gate electrode may be surrounded by a channel.

Figure 2:
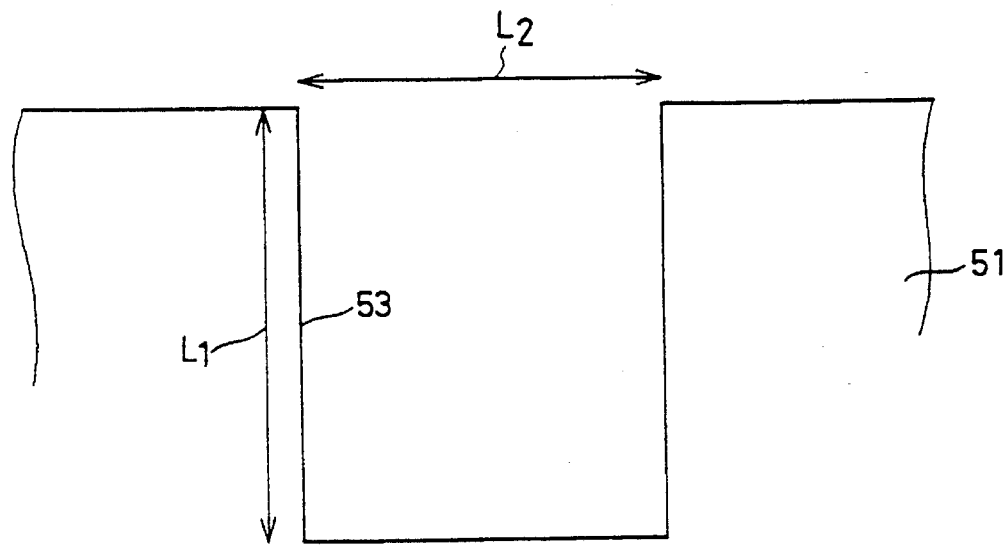
FIGS. 2 through 15 are sectional views of a substrate showing respective steps of a method of manufacturing the field effect transistor of the first embodiment according to the invention.
Figure 3:
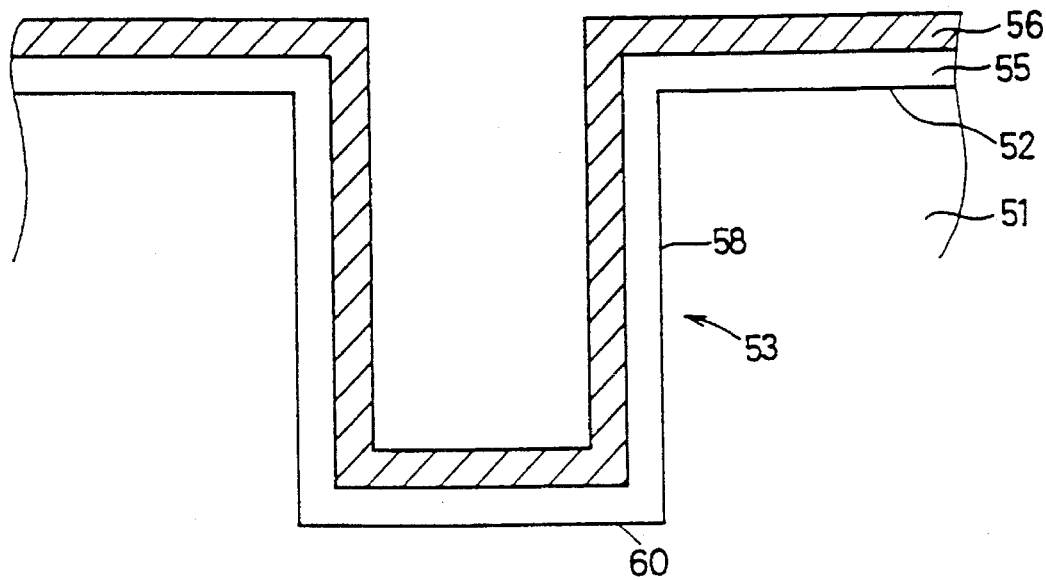

A method of manufacturing the field effect transistor shown in FIG. 1 will be described hereinbelow. As shown in FIG. 2, trench 53 is formed in silicon substrate 51 using photolithography and etching. Trench 53 has a depth $L_1$ of 1.5 μm, a width $L_2$ of 1.35 μm and a length of 0.6 μm.

A silicon oxide film 55 is formed on main surface 52 of silicon substrate 51, a side surface 58 of trench 53 and a bottom surface 60 of trench 53 using a thermal oxidation method. The thickness of silicon oxide film 55 is 100 nm. Polycrystalline silicon film 56 is formed on silicon oxide film 55 using a low pressure CVD method. The thickness of polycrystalline silicon film 56 is 200 nm.

Figure 4:
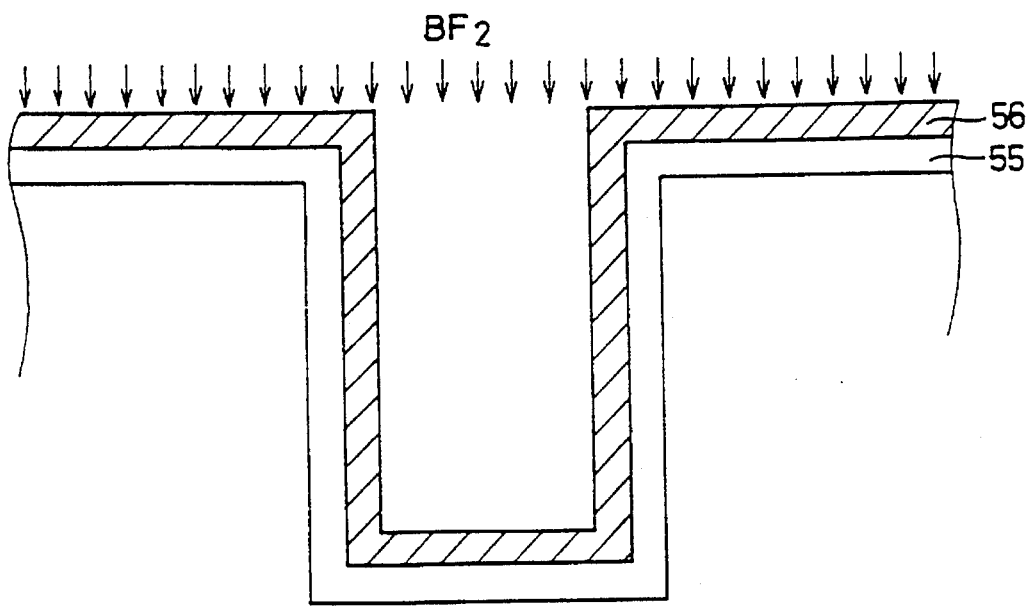
Figure 5:
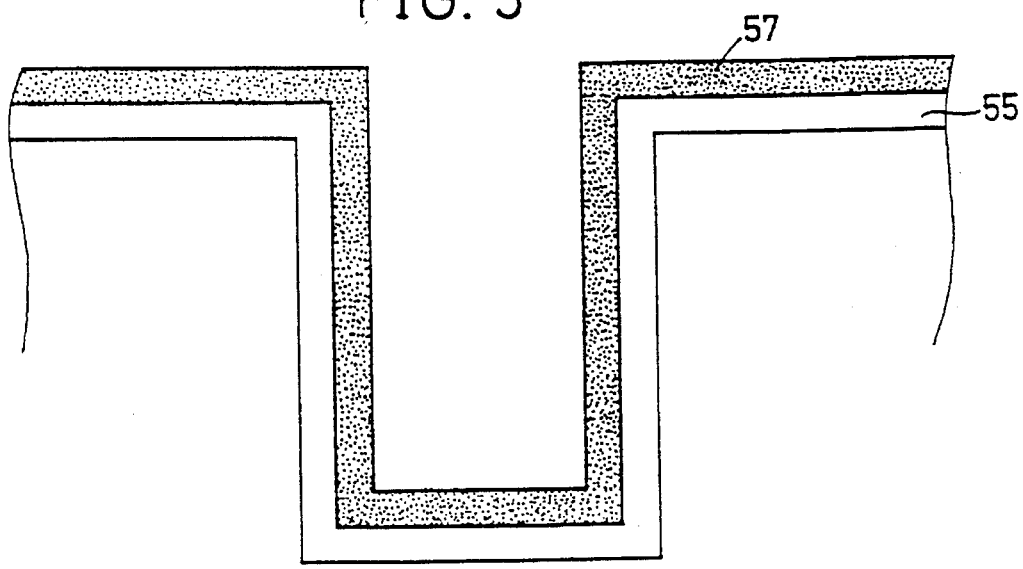

As shown in FIG. 4, $BF_2$ is ion-implanted into polycrystalline silicon film 56, and activated in heat treatment, so that source/drain film 57 is formed as shown in FIG. 5. Source/drain film 57 is patterned to a desired shape using photolithography and etching.

Figure 6:
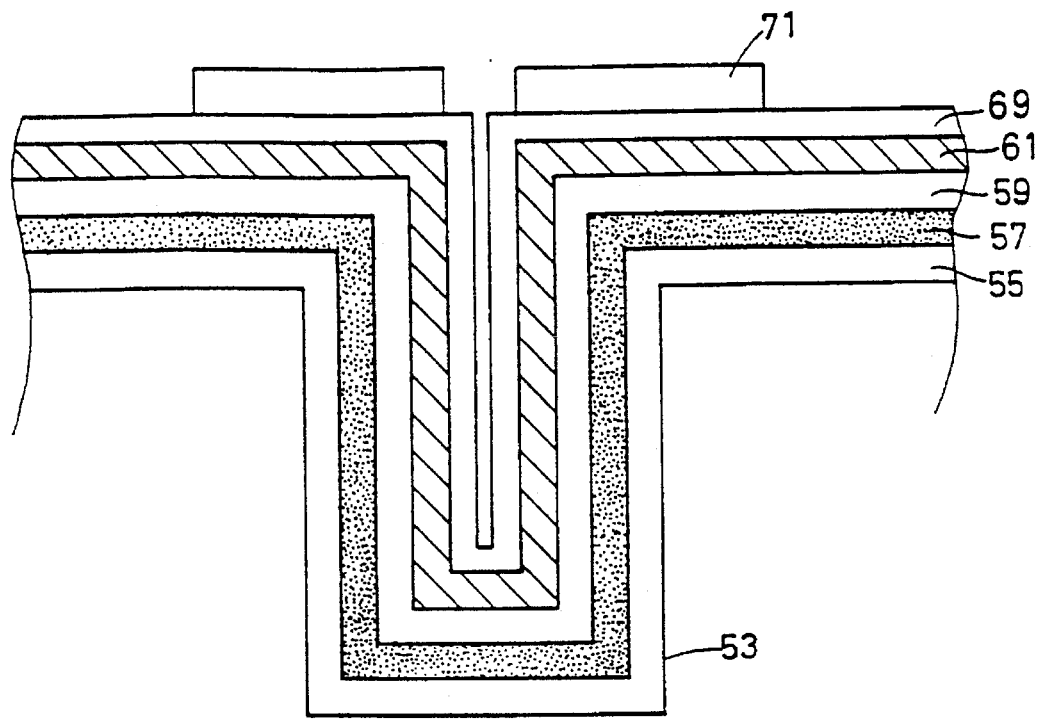

Referring to FIG. 6, silicon oxide film 59 is formed on source/drain film 57 using the low pressure CVD method. The thickness of silicon oxide film 59 is 100 nm. Polycrystalline silicon film 61 having a thickness of 100 μm is formed on silicon oxide film 59 using the low pressure CVD method. Polycrystalline silicon film 61 is to be a gate electrode. Silicon oxide film 69 having a thickness of 100 nm is formed on polycrystalline silicon film 61 using the low pressure CVD method. Resist 71 is formed on silicon oxide film 69 and subjected to a predetermined patterning.

Figure 7:
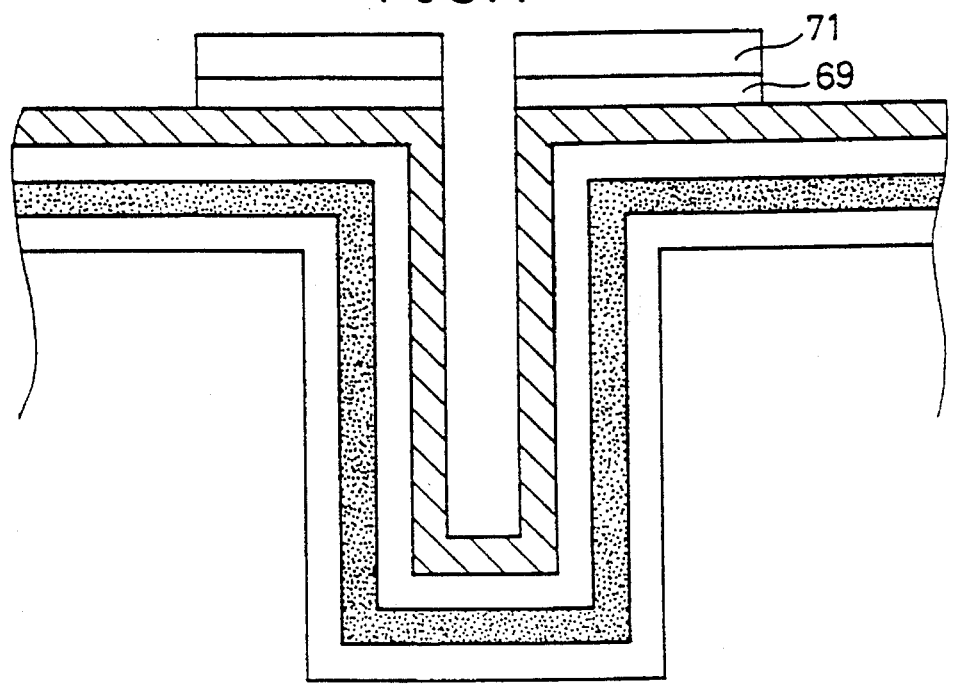

Referring to FIG. 7, silicon oxide film 69 is etched using hydrogen fluoride with resist 71 being a mask.

Figure 8:
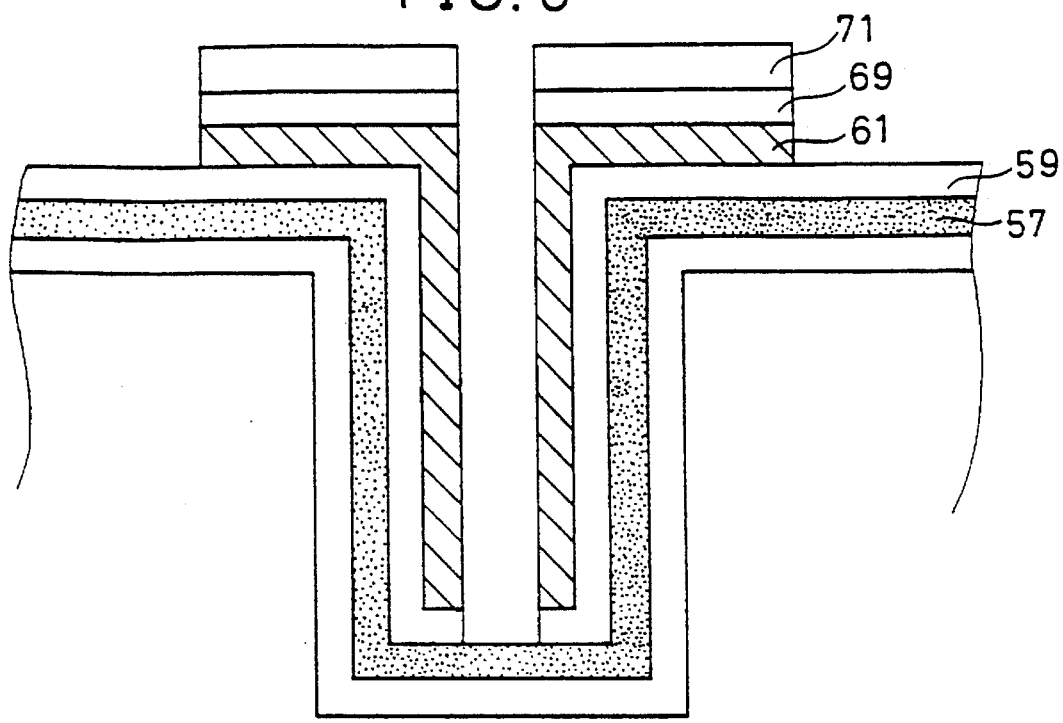

Referring to FIG. 8, polycrystalline silicon film 61 and silicon oxide film 59 are anisotropically etched using resist 71 as a mask to have source/drain film 57 exposed.

Figure 9:
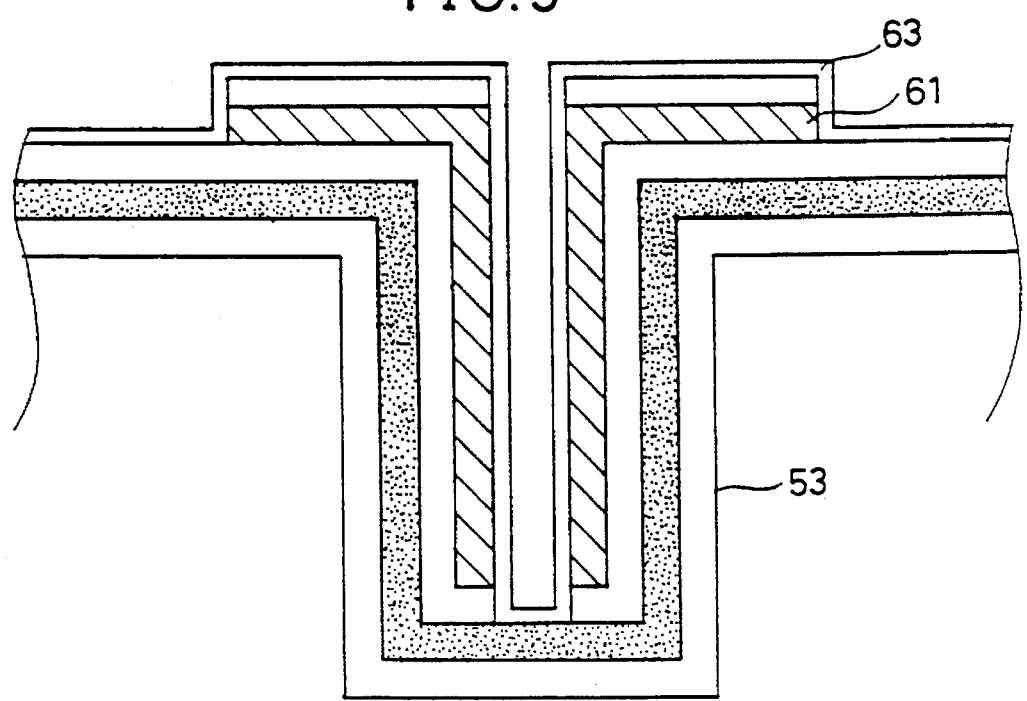

Referring to FIG. 9, gate insulating film 63 is formed in a thickness of 25 nm on gate electrode 61 using the low pressure CVD method.

Figure 10:
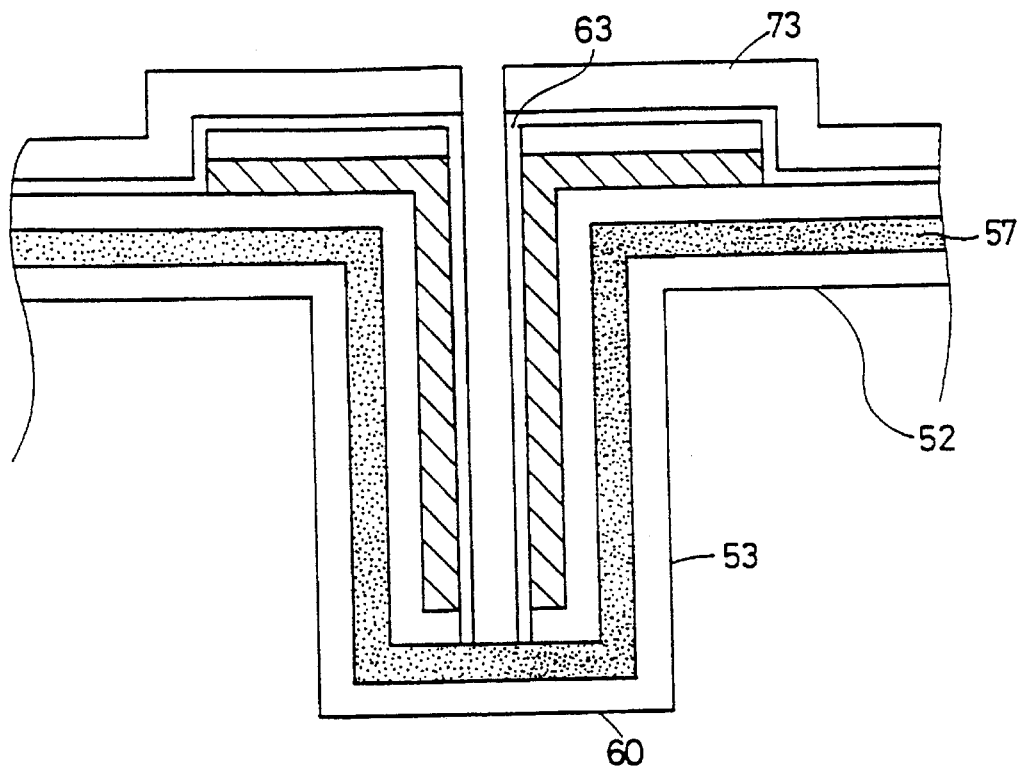

Referring to FIG. 10, resist 73 is formed on the entirety of main surface 52 and subjected to a predetermined patterning. Gate insulating film 63 is etched using resist 73 as a mask, so that source/drain film 57 on the side of bottom surface 60 of trench 53 is exposed.

Figure 11:
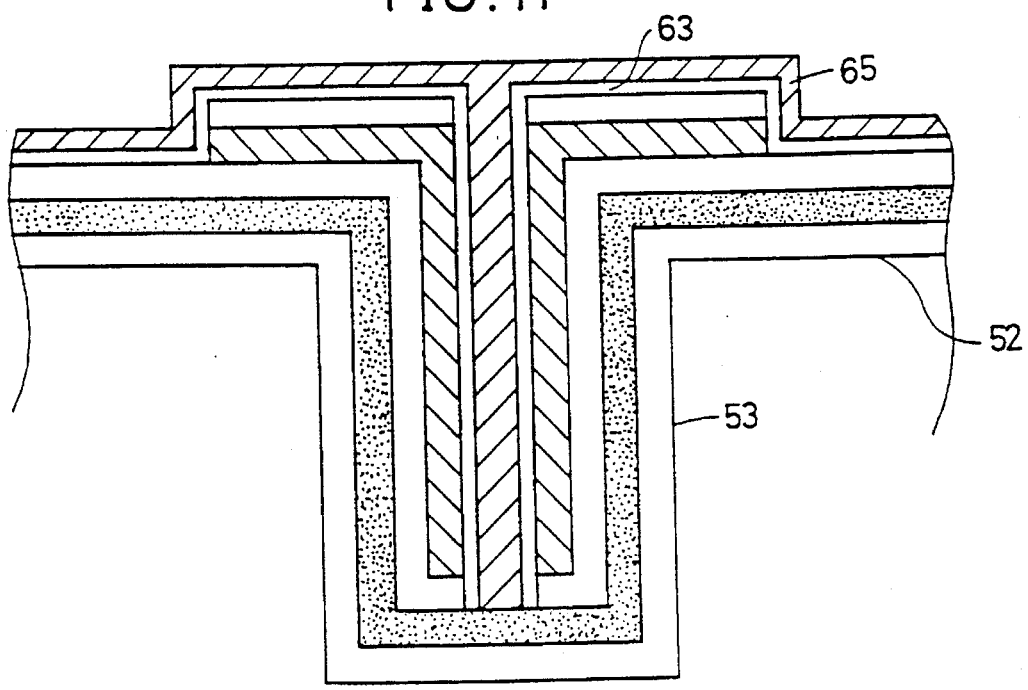

Referring to FIG. 11, a polycrystalline silicon film 65 is formed in a thickness of 150 nm on the entirety of main surface 52 using the low pressure CVD method, so that trench 53 is completely filled.

Figure 12:
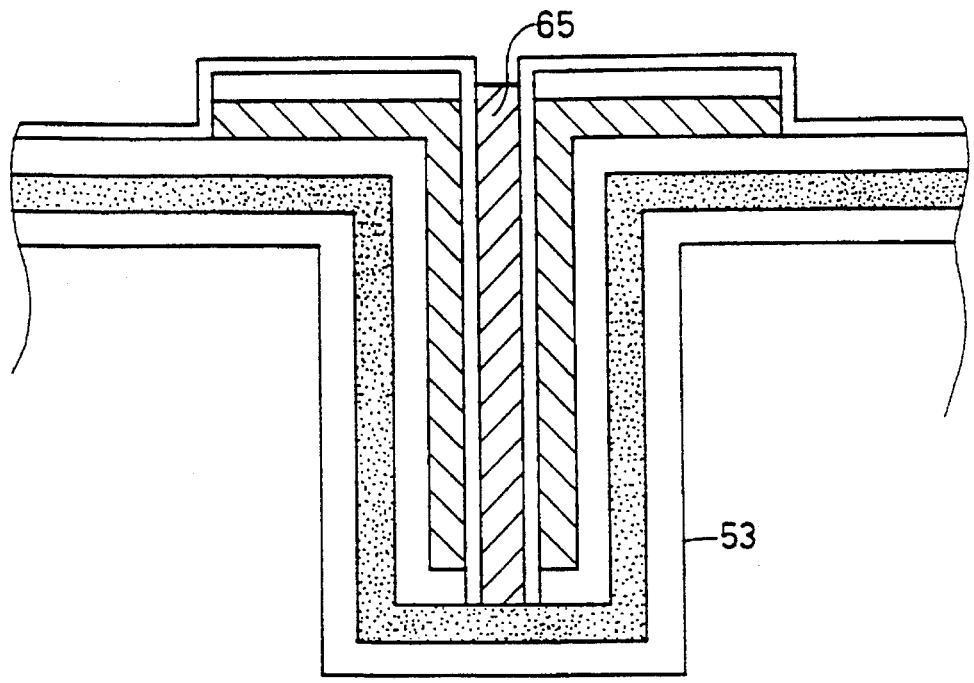

Referring to FIG. 12, polycrystalline silicon film 65 is isotropically etched and only polycrystalline silicon film 65 in trench 53 remains.

Figure 13:
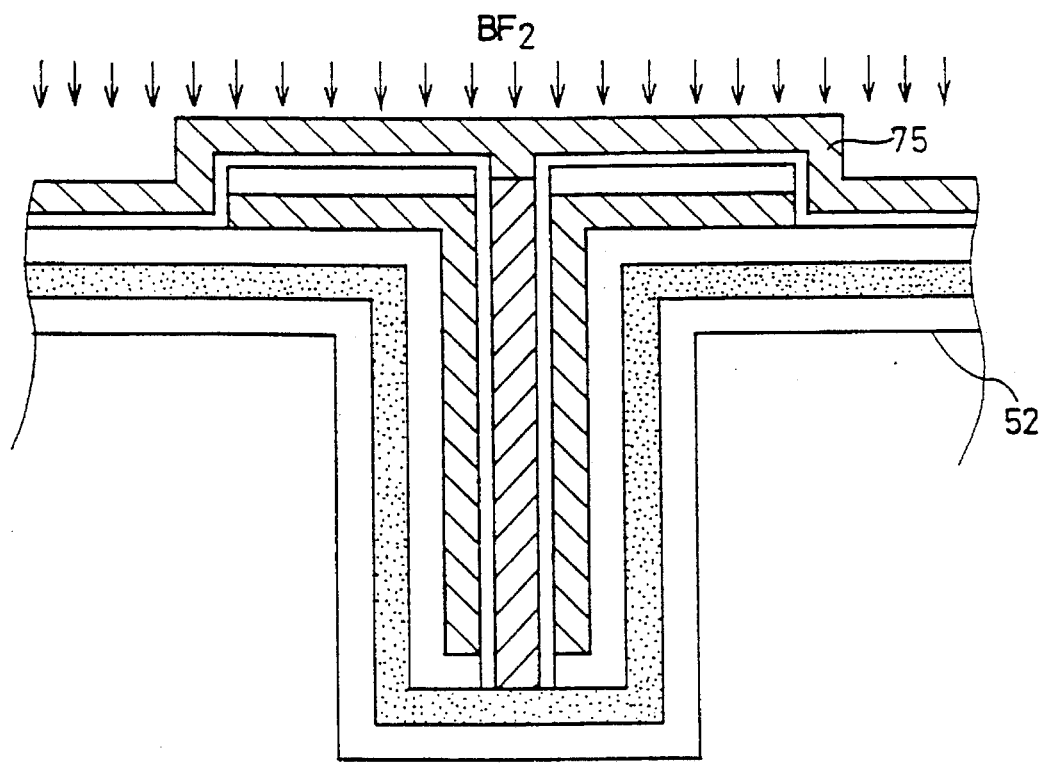
Figure 14:
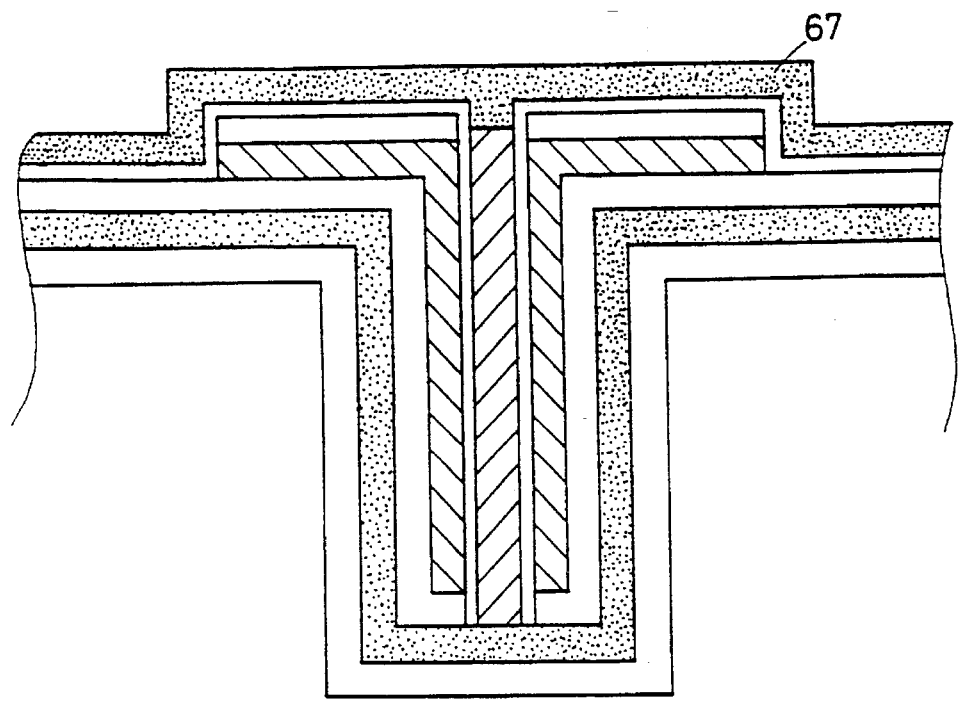

Referring to FIG. 13, polycrystalline silicon film 75 is formed in a thickness of 200 nm on the entirety of main surface 52 using the low pressure CVD method. $BF_2$ is ion-implanted into polycrystalline silicon film 75 and activated in heat treatment, so that source/drain film 67 is formed, as shown in FIG. 14.

Figure 15:
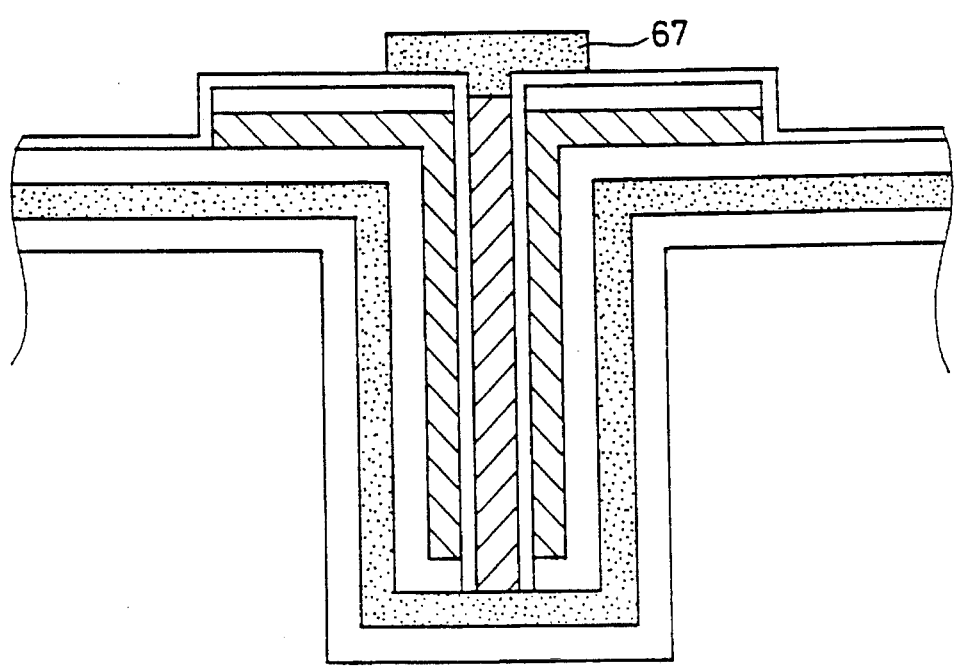

Referring to FIG. 15, source/drain film 67 is patterned to a desired shape using photolithography and etching.

A Second Embodiment

Figure 16:
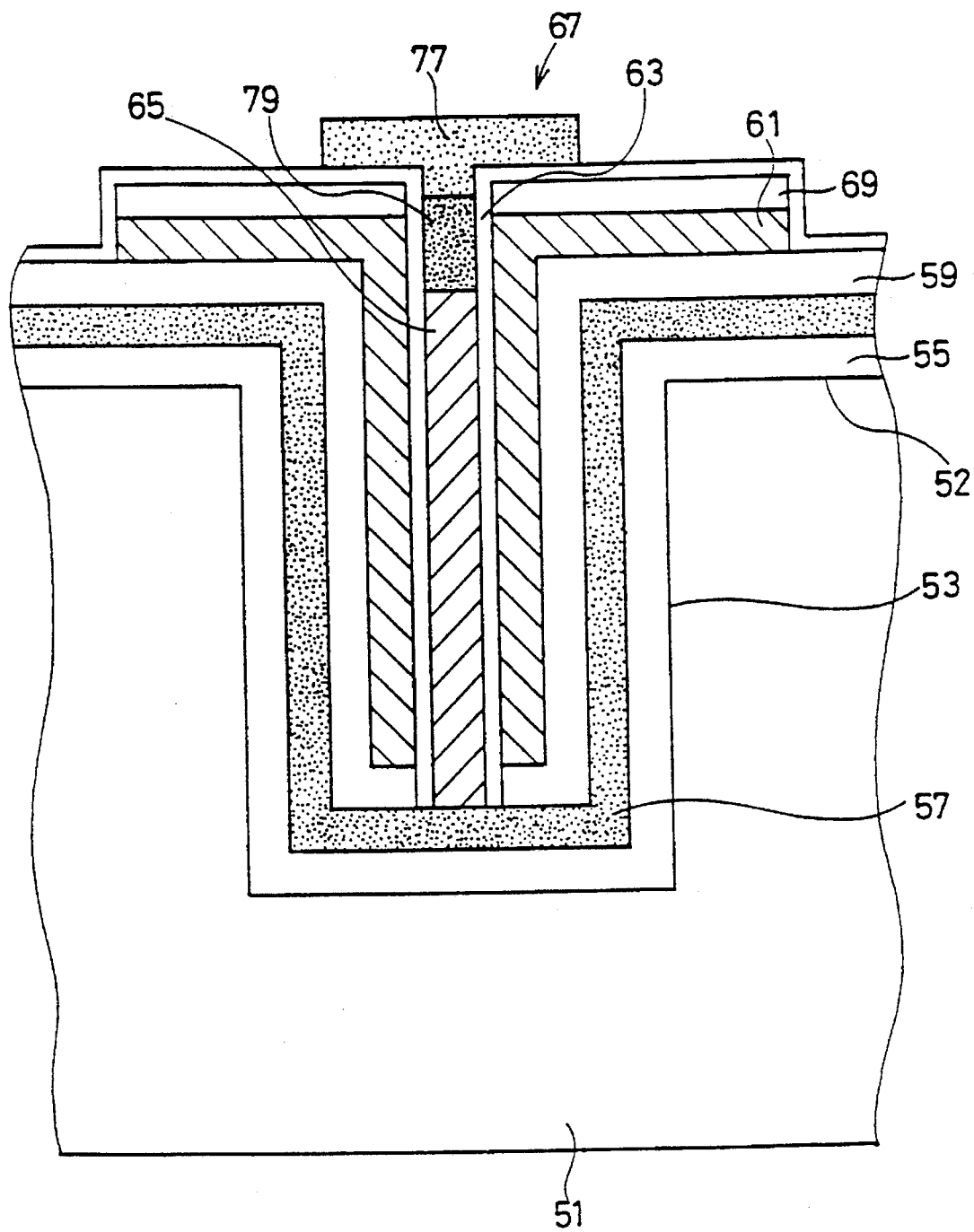
FIG. 16 is a sectional view of a field effect transitor of a second embodiment according to the invention.

FIG. 16 is a sectional view of a field effect transistor of a second embodiment according to the present invention. The same reference characters as those in FIG. 1 denote the same portions. In the second embodiment, drain film 67 has an LDD (Lightly Doped Drain) structure. That is, source/drain film 67 is formed of a high concentration source/drain region film 77 and a low concentration source/drain film 79. The field effect transistor of the second embodiment according to the invention has the LDD structure, so that a short channel effect can be further suppressed.

Figure 17:
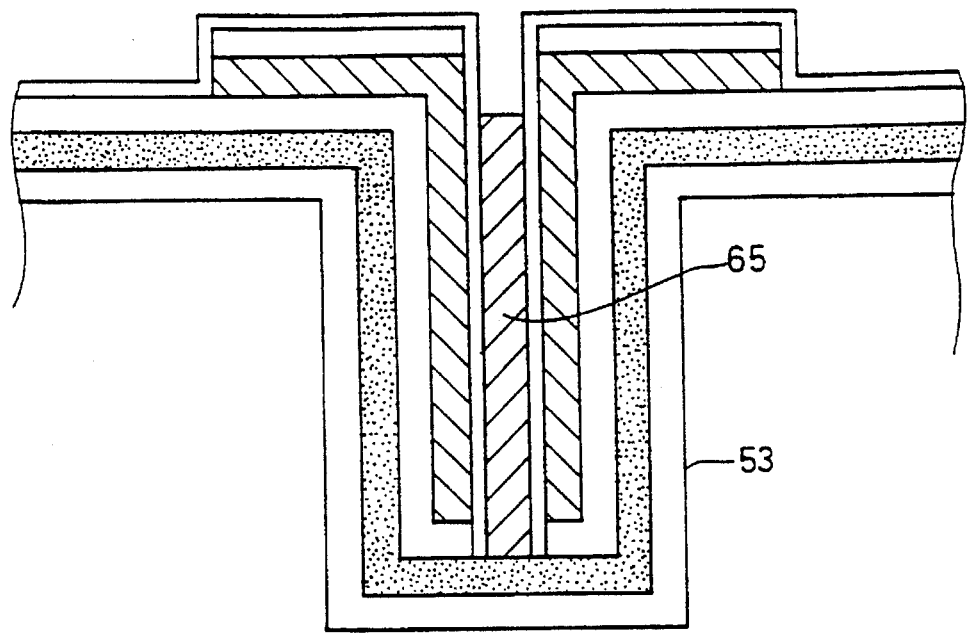
FIGS. 17 through 20 are sectional views of a silicon substrate showing respective steps of a method of manufacturing the field effect transistor of the second embodiment according to the invention.

A method of manufacturing the field effect transistor of the second embodiment according to the invention will be described. Steps are the same as far as the step shown in FIG. 11. The whole surface of polycrystalline silicon film 65 is etched isotropically as shown in FIG. 17. An etching time is controlled so that the depth of groove $l_1$ is 0.6 μm.

Figure 18:
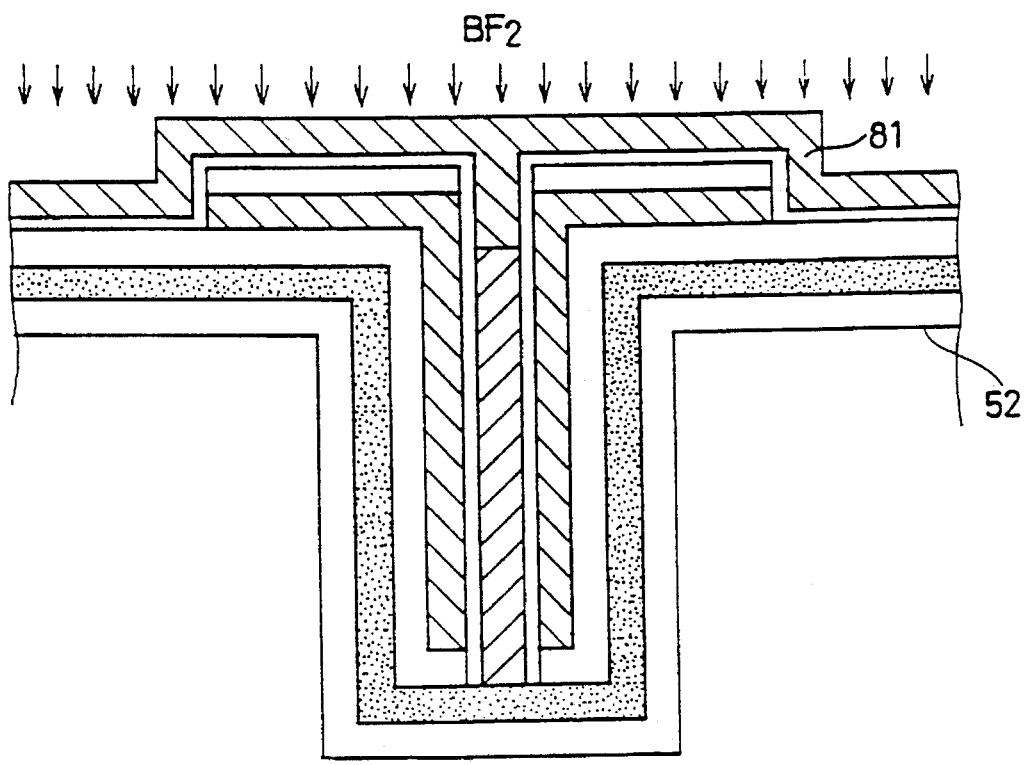
Figure 19:
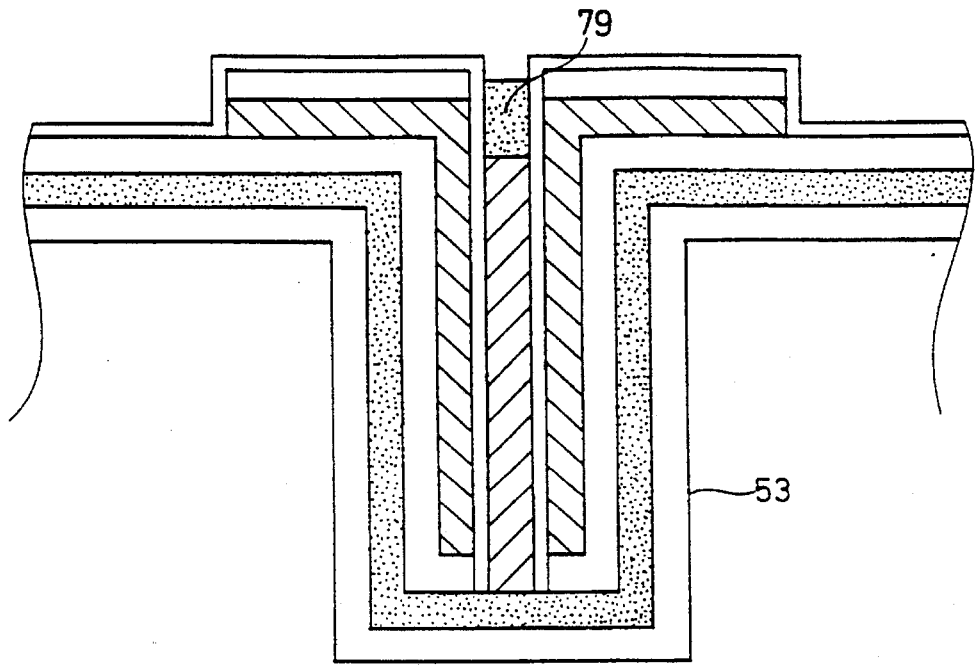

Referring to FIG. 18, a polycrystalline silicon film 81 is deposited in a thickness of 150 nm using the low pressure CVD method. $BF_2$ is ion-implanted into polycrystalline silicon film 81 and activated in heat treatment, so that low concentration source/drain film 79 is formed. As shown in FIG. 19, the whole surface of low concentration source/drain film 79 is patterned to a predetermined shape by etching.

Figure 20:
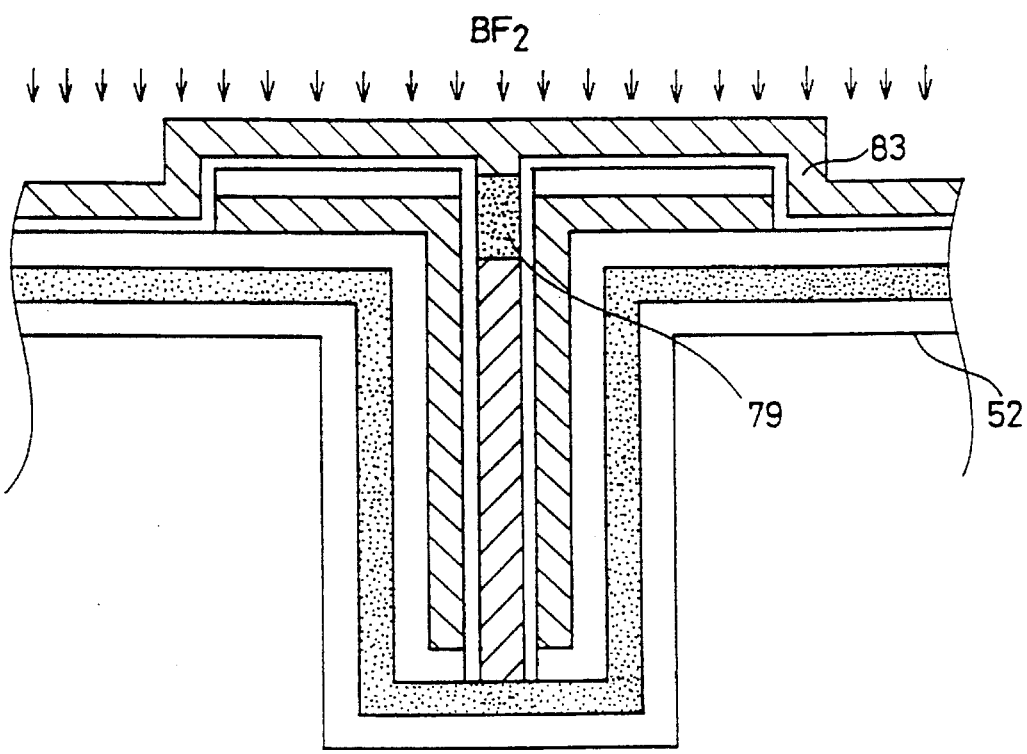

Referring to FIG. 20, a polycrystalline silicon film 83 of a thickness of 200 nm is formed on the whole main surface 52 using the low pressure CVD method. $BF_2$ is ion-implanted into polycrystalline silicon film 83 and activated in heat treatment, so that high concentration source/drain film 77 is formed. High concentration source/drain film 77 is patterned to a shape as shown in FIG. 16 using photolithography and etching.

A Third Embodiment

Figure 21:
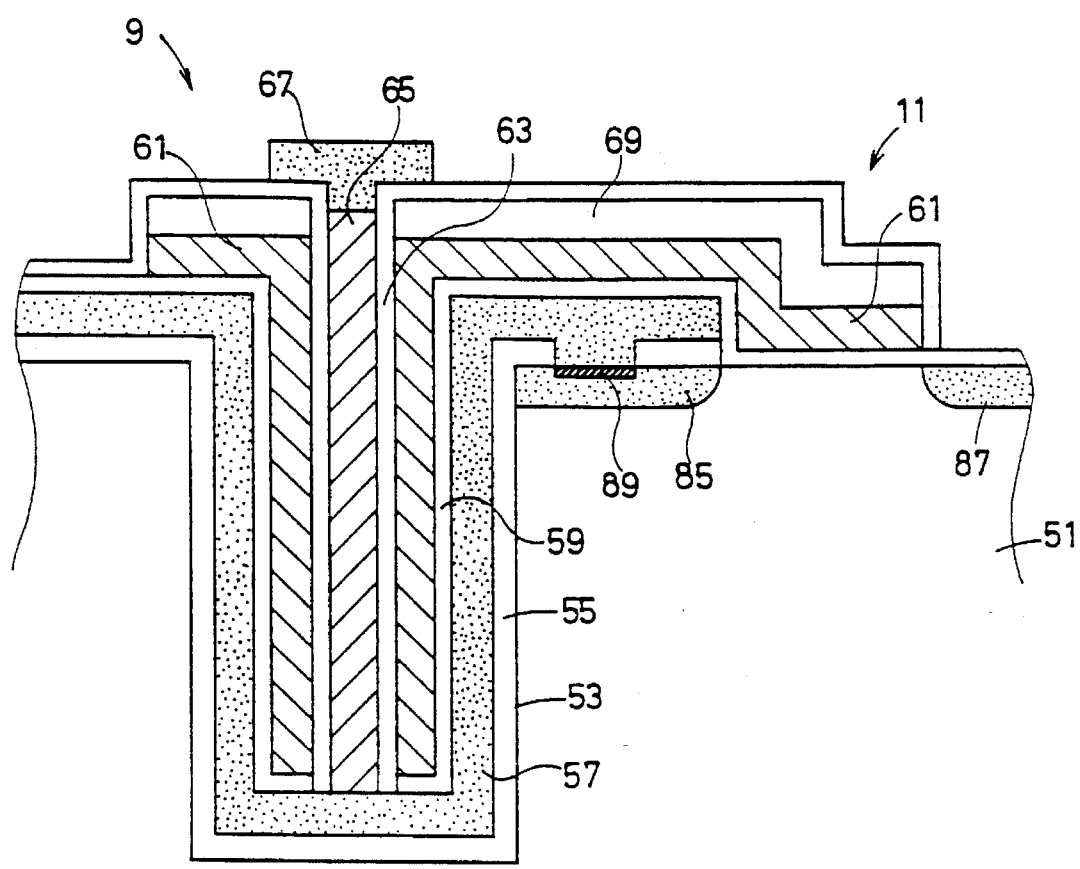
FIG. 21 is a sectional view of a third embodiment of a field effect transistor according to the invention.

FIG. 21 is a sectional view of a field effect transistor of a third embodiment according to the invention. A p type field effect transistor 9 and an n type field effect transistor 11 constitute a CMOS (complementary MOS) inverter. The reference character same as those in FIG. 1 denote the same portions. A detailed description of p type field effect transistor 9 is not repeated.

n type field effect transistor 11 includes drain region 85 and source region 87 spaced apart from each other in silicon substrate 51. A gate electrode 61 of p type field effect transistor 9 also serves as a gate electrode of n type field effect transistor 11.

A silicide film 89 is provided in a junction portion of drain film 57 and drain region 85. Drain film 57 is of p type. Drain region 85 is of n type. Therefore, if drain film 57 and drain region 85 are directly joined, a pn junction is caused and this portion becomes a diode. In order to prevent this, silicide film 89 is provided.

Figure 37:
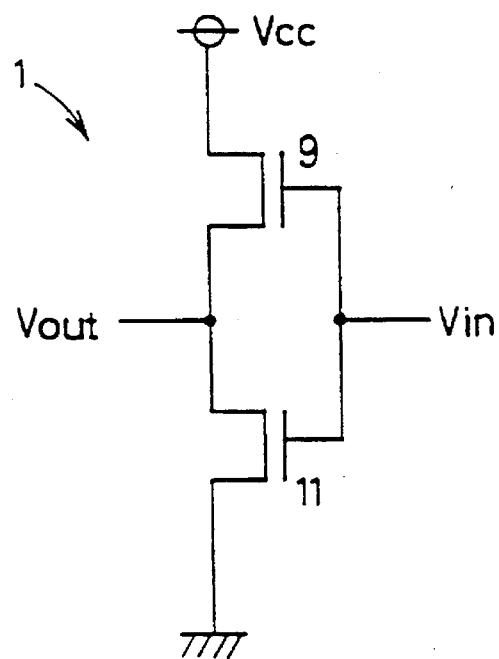
FIG. 37 is a schematic diagram of an equivalent circuit of a CMOS inverter.
Figure 38:
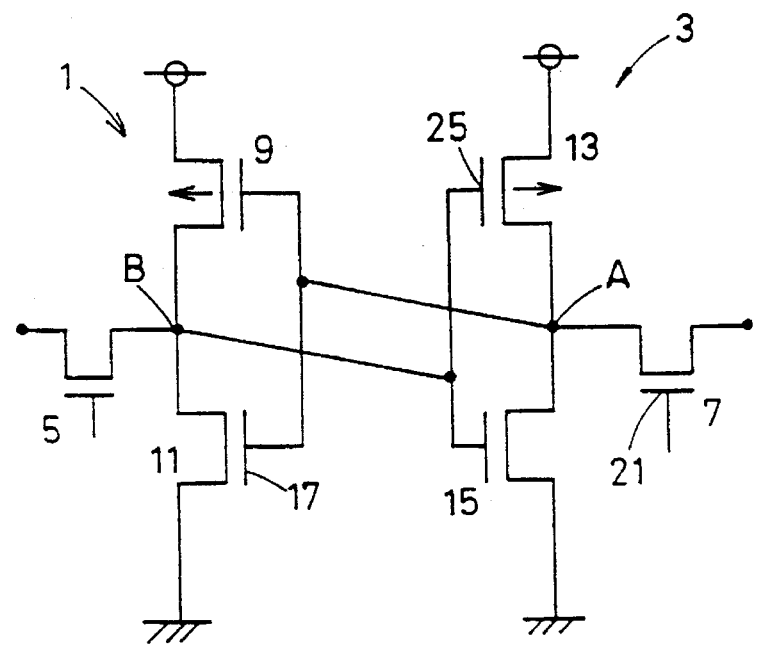
FIG. 38 is a schematic diagram of an equivalent circuit showing details of a flipflop portion of the memory cell off the SRAM shown in FIG. 36.
Figure 39:
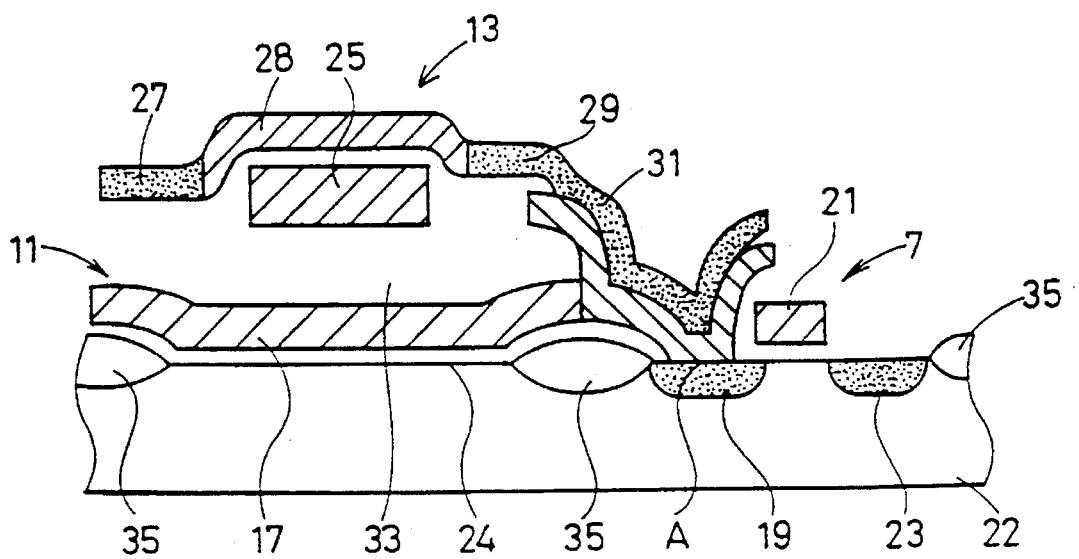
FIG. 39 is a sectional view of one example of a conventional memory cell of an SRAM.
Figure 40:
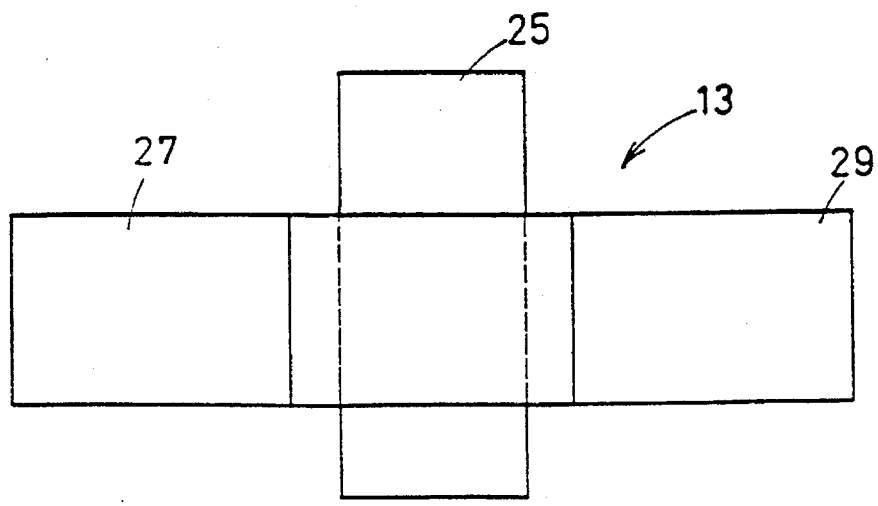
FIG. 40 is a plan view of a PMOS transistor 13 shown in FIG. 39.
Figure 41:
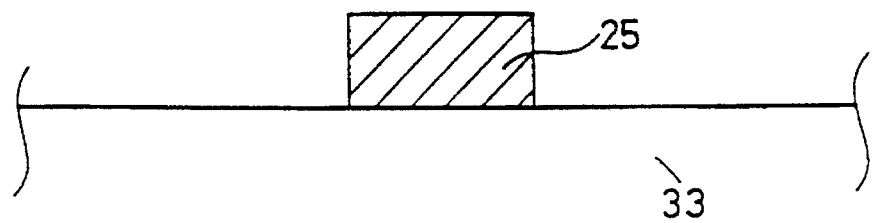
FIGS. 41 through 44 are sectional views showing respective steps of a method of manufacturing PMOS transistor 13 shown in FIG. 39.
Figure 42:
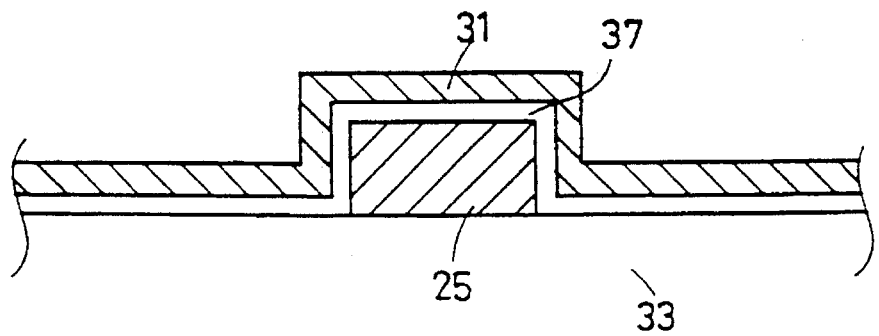
Figure 43:
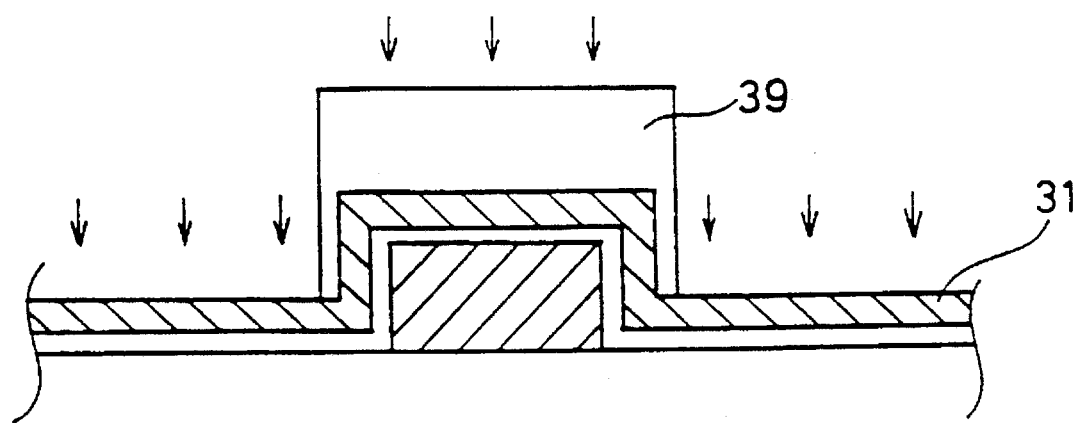
Figure 44:
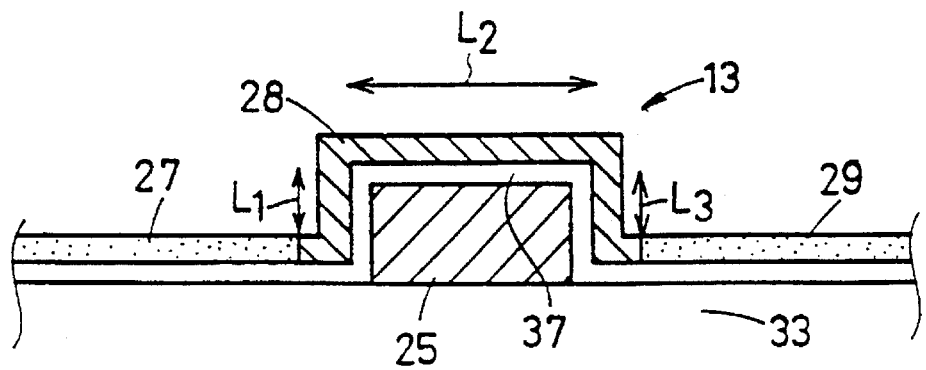
Figure 45:
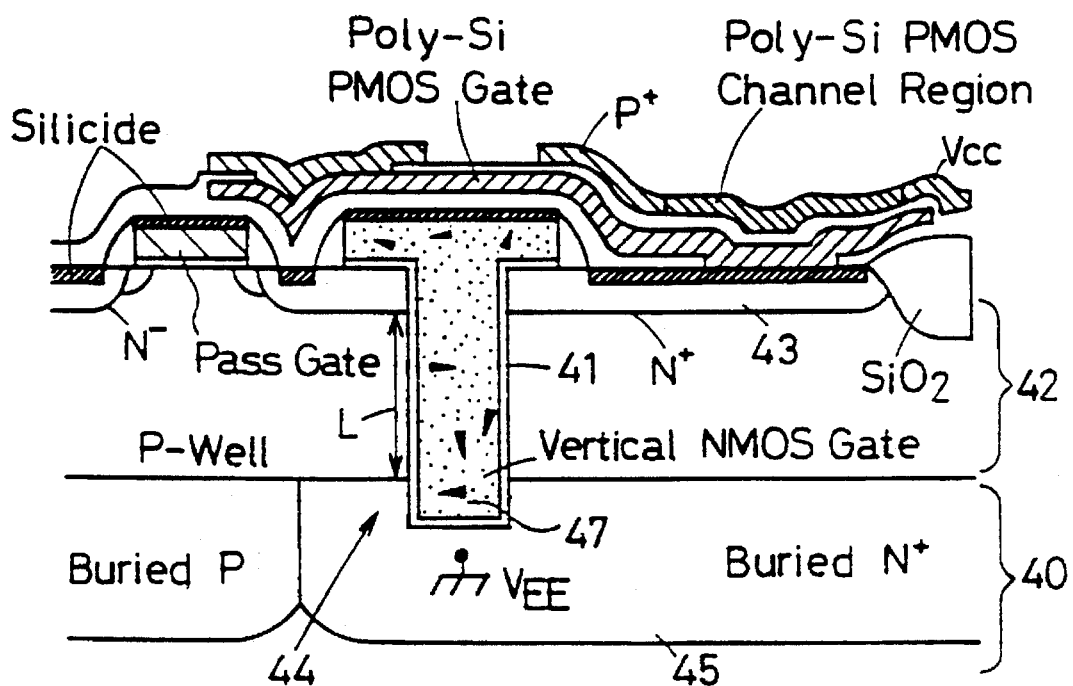
FIG. 45 is a sectional view of another example of a conventional SRAM.

FIG. 37 is a schematic diagram of an equivalent circuit of the CMOS inverter. Referring to FIGS. 21 and 37, source film 67 is used as a power supply line (Vcc) and a source of p type field effect transistor 9. Polycrystalline silicon film 61 is used as a gate electrode of p type field effect transistor 9 and a gate electrode of n type field effect transistor 11. Drain film 57 is used as a drain of p type field effect transistor 9. Drain region 85 is used as a drain of n type field effect transistor 11. Source region 87 is used as a source of n type field effect transistor 11. Source region 87 is connected to ground.

A Fourth Embodiment

Figure 22:
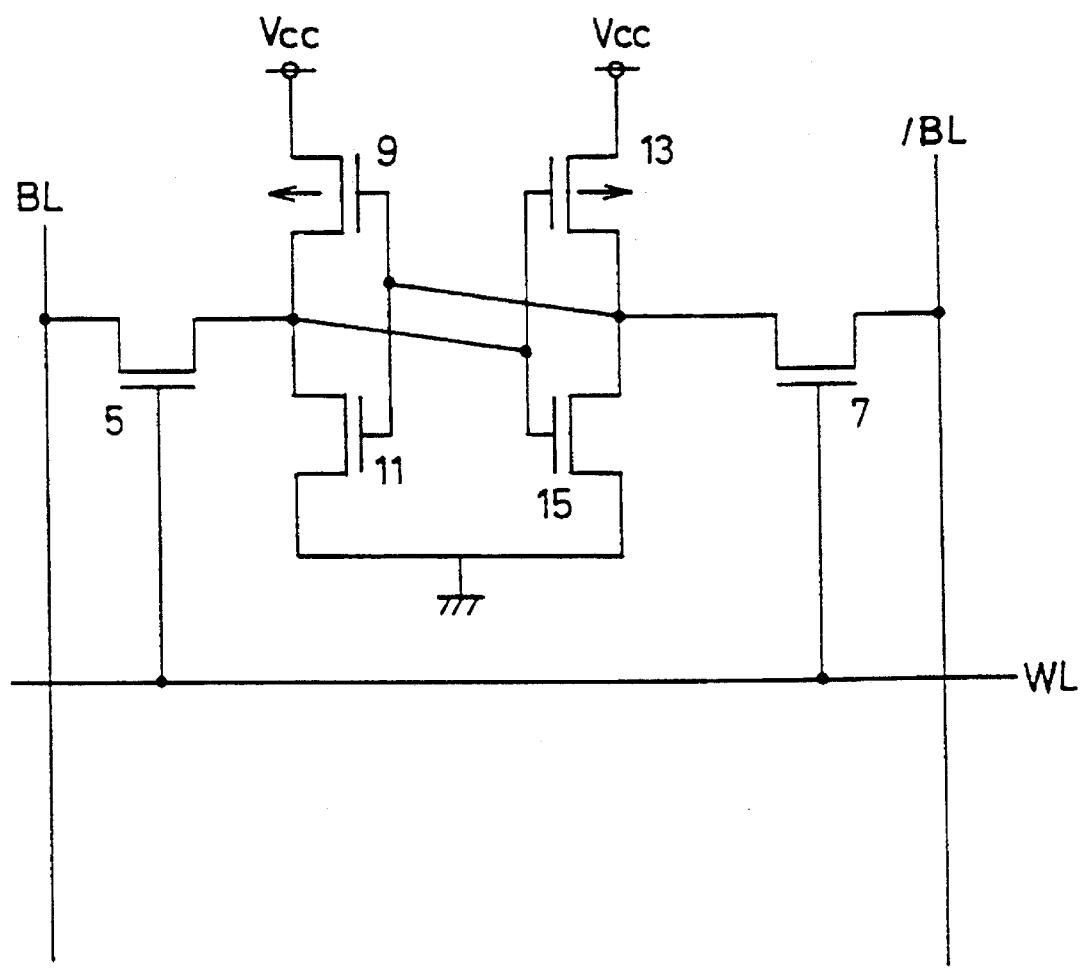
FIG. 22 is a schematic diagram of an equivalent circuit of a memory cell of an SRAM using the field effect transistor of the third embodiment according to the invention.
Figure 23:
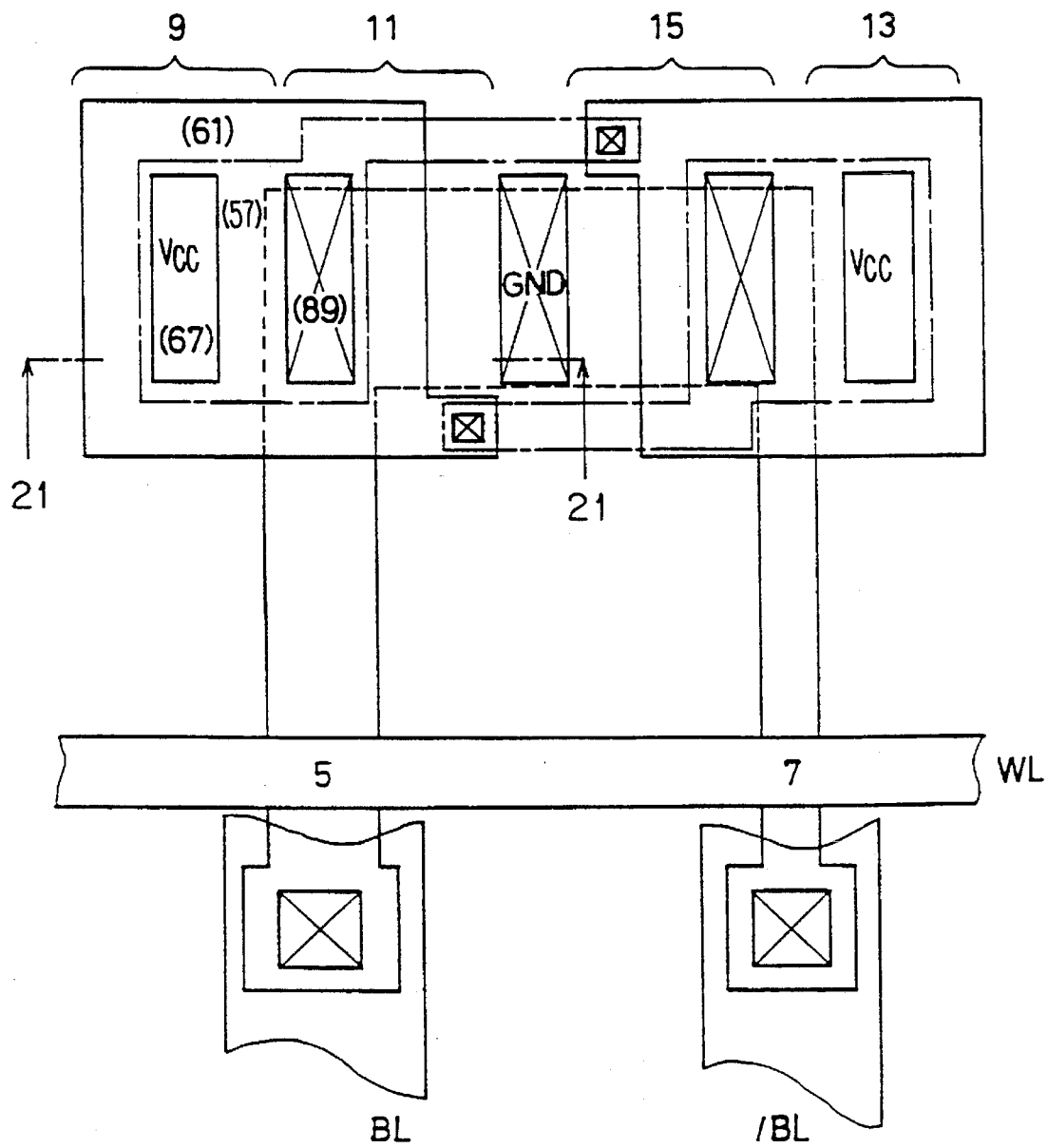
FIG. 23 is a schematic plan view of the memory cell of the SRAM shown in FIG. 22.

FIG. 22 is a schematic diagram of an equivalent circuit of a memory cell of an SRAM. The memory cell includes access transistors 5, 7 which are n type transistors, a PMOS transistors 9, 13, and NMOS transistors 11, 15. FIG. 23 is a schematic plan view of the memory cell of the SRAM shown in FIG. 22. FIG. 21 is a cross section taken along a line A—A.

Figure 24:
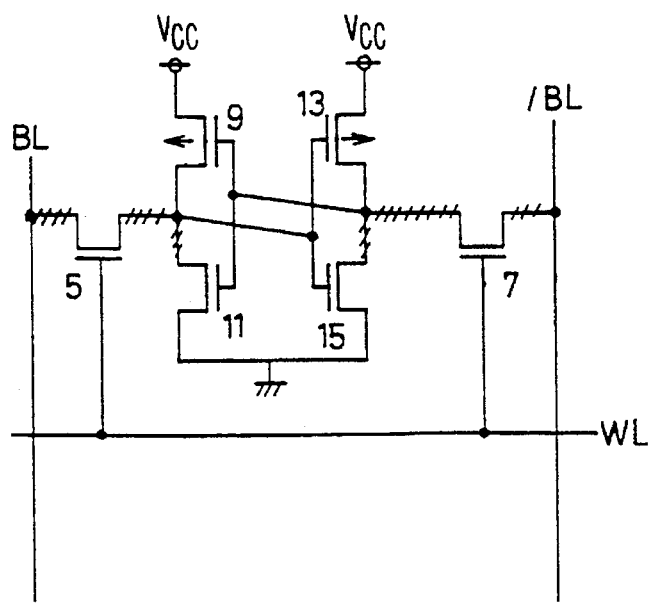
FIG. 24 is a schematic diagram of an equivalent circuit of the memory cell of the SRAM for use in explaining a corresponding relationship between FIGS. 22 and 23, and corresponds to FIG. 25.
Figure 25:
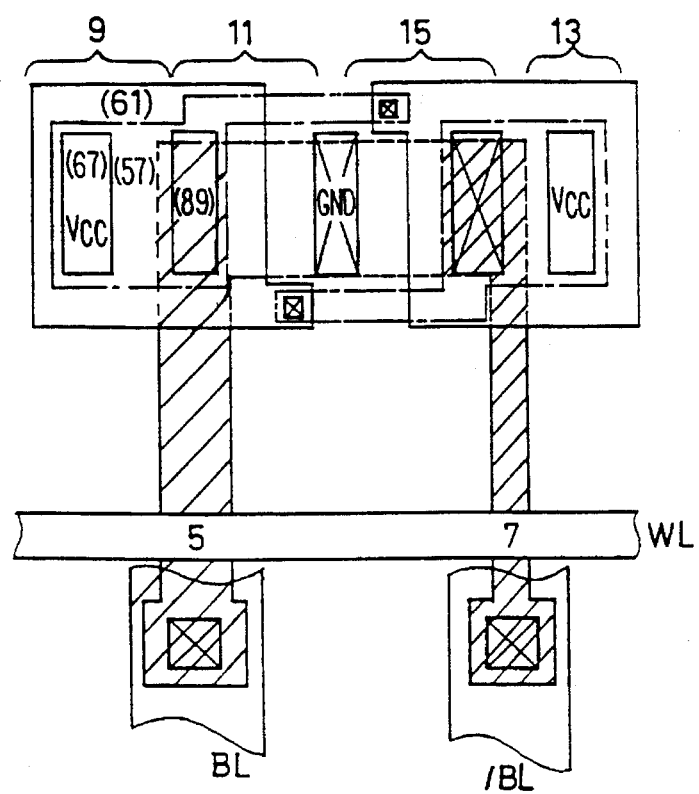
FIG. 25 is a schematic plan view of the memory cell of the SRAM for use in explaining the corresponding relationship between FIGS. 22 and 23, and corresponds to FIG. 24
Figure 26:
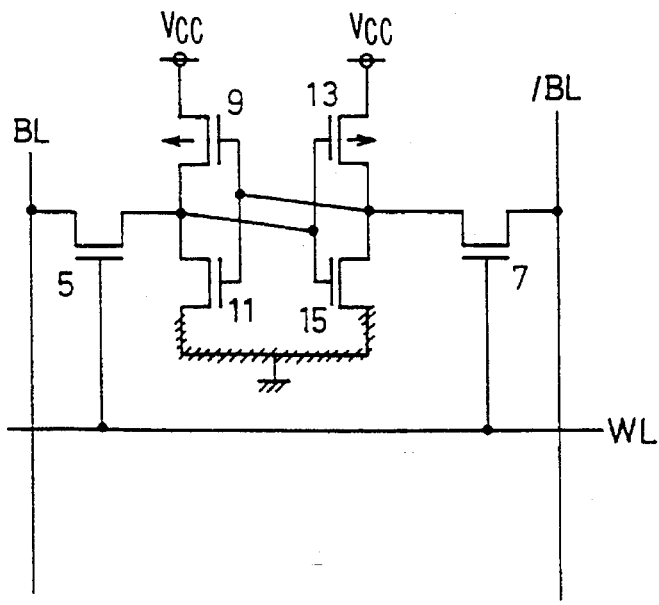
FIG. 26, is a schematic diagram of an equivalent circuit of the memory cell of the SRAM for use in explaining the corresponding relationship between FIGS. 22 and 23, and corresponds to FIG. 27.
Figure 27:
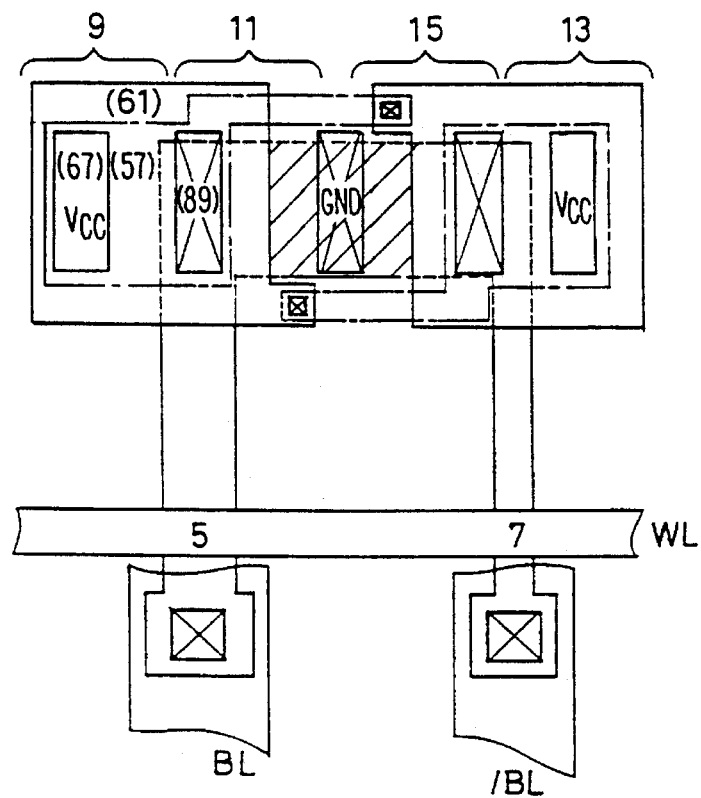
FIG. 27 is a schematic plan view of the memory cell of the SRAM for use in explaining the corresponding relationship between FIGS. 22 and 23, and corresponds to FIG. 26.
Figure 28:
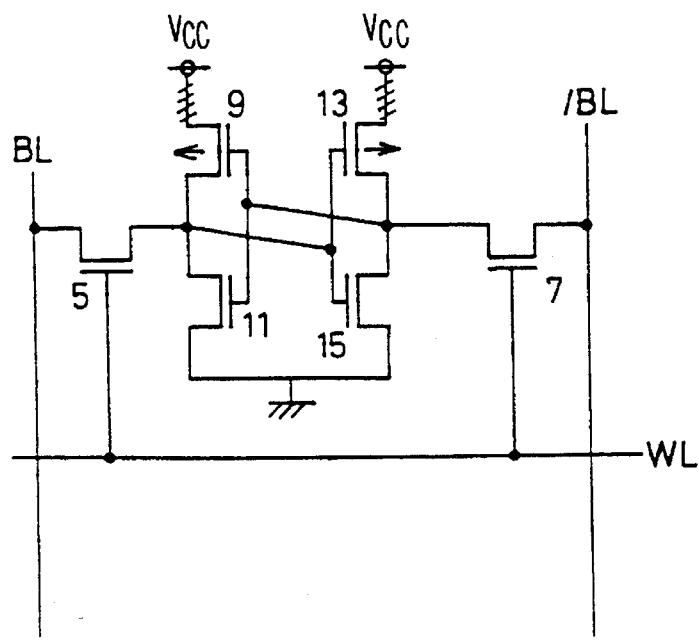
FIG. 28 is a schematic diagram of an equivalent circuit of the memory cell of the SRAM for use in explaining the corresponding relationship between FIGS. 22 and 23, and corresponds to FIG. 29.
Figure 29:
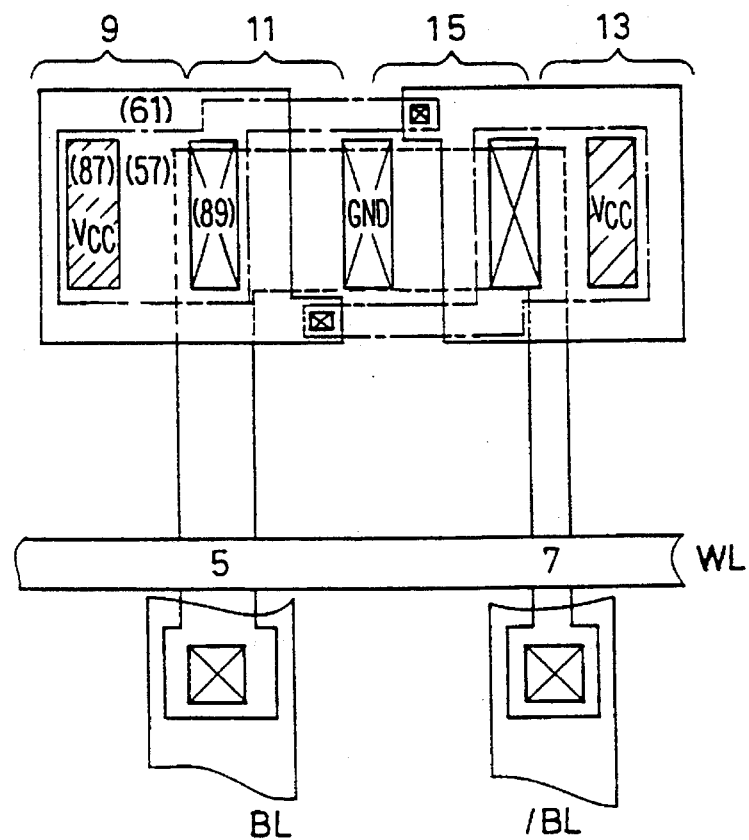
FIG. 29 is a schematic plan view of the memory cell of the SRAM for use in explaining the corresponding relationship between FIGS. 22 and 23, and corresponds to FIG. 28.
Figure 30:
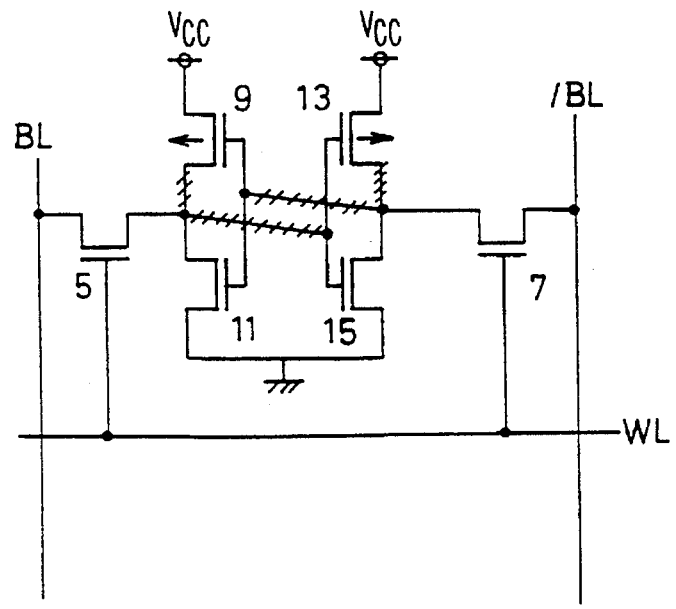
FIG. 30 is a schematic diagram of an equivalent circuit of the memory cell of the SRAM for use in explaining the corresponding relationship between FIGS. 22 and 23, and corresponds to FIG. 31.
Figure 31:
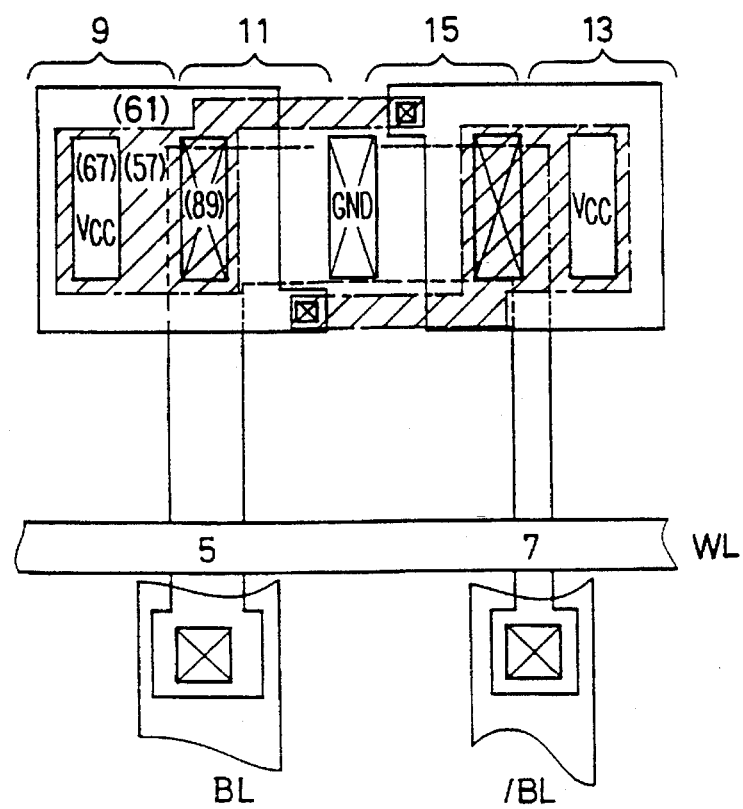
FIG. 31 is a schematic plan view of the memory cell of the SRAM in use for explaining the relationship between FIGS. 22 and 23, and corresponds to FIG. 30.
Figure 32:
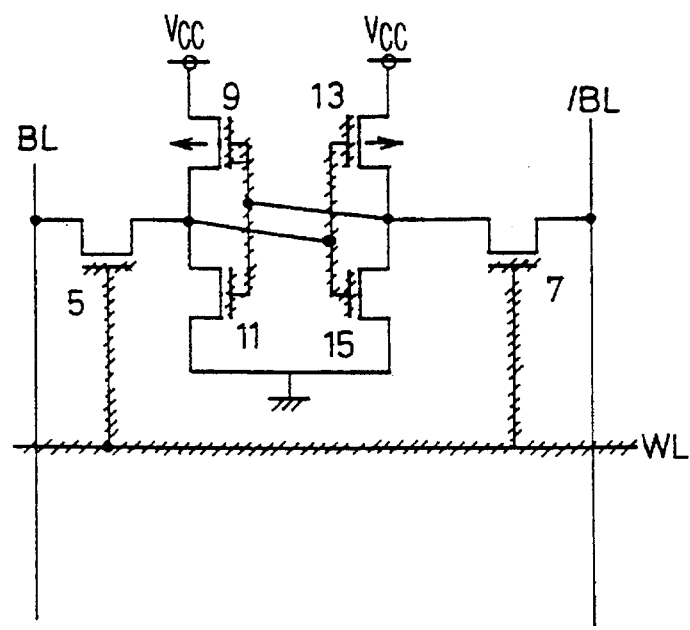
FIG. 32 is a schematic diagram of an equivalent circuit of the memory cell of the SRAM for use in explaining the corresponding relationship between FIGS. 22 and 23, and corresponds to FIG. 33.
Figure 33:
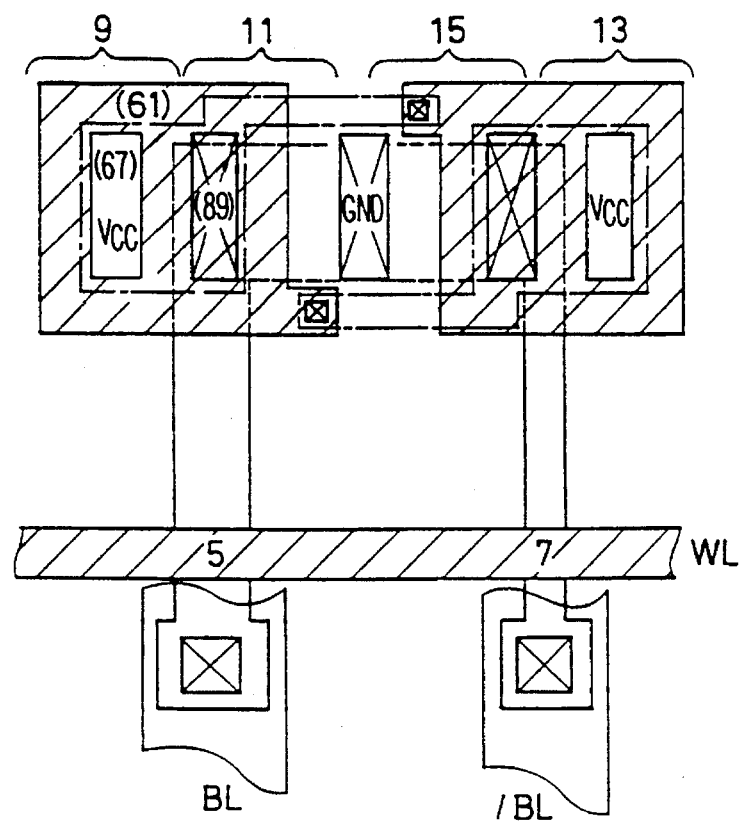
FIG. 33 is a schematic plan view of the memory cell of the SRAM for use in explaining the corresponding relationship between FIGS. 22 and 23, and corresponds to FIG. 32.
Figure 34:
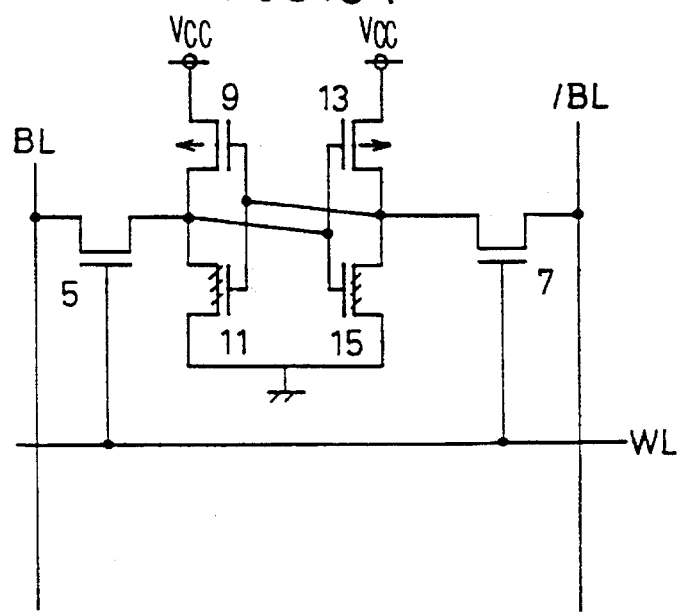
FIG. 34 is a schematic diagram of an equivalent circuit of the memory cell of the SRAM for use in explaining the relationship between FIGS. 22 and 23, and corresponds to FIG. 35.
Figure 35:
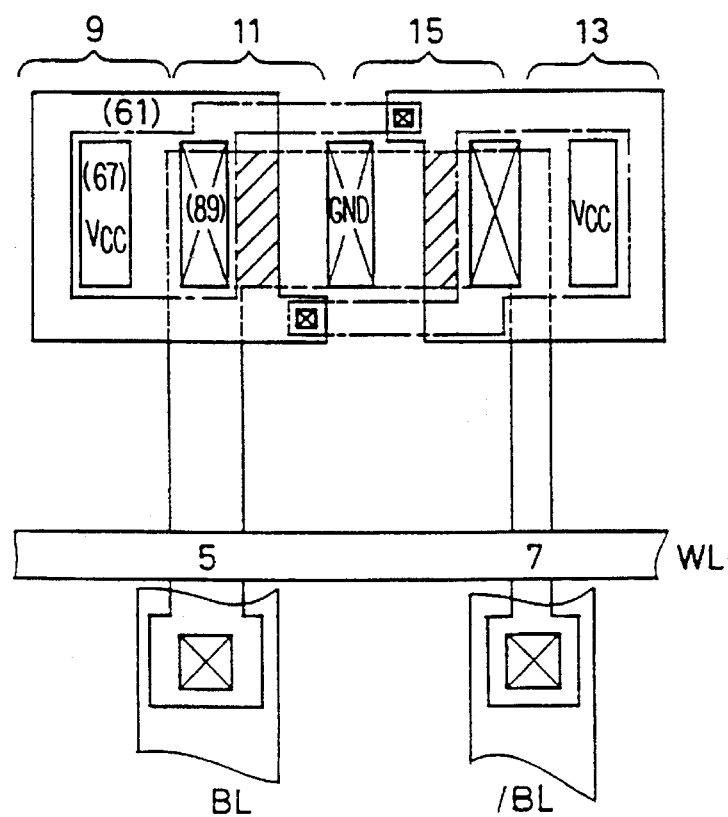
FIG. 35 is a schematic plan view of the memory cell of the SRAM for use in explaining the corresponding relationship between FIGS. 22 and 23, and corresponds to FIG. 34.
Figure 36:
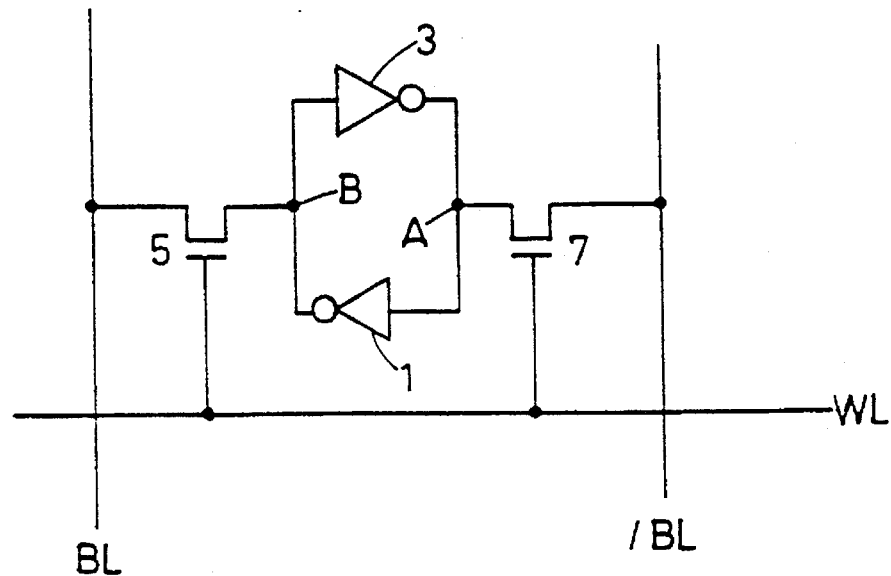
FIG. 36 is a schematic diagram of an equivalent circuit of the memory cell of the SRAM.

A corresponding relationship between the schematic diagram of the equivalent circuit shown in FIG. 22 and the schematic plan view shown in FIG. 23 will be described hereinbelow. The portion marked with //// in FIG. 24 corresponds to the hatched portion in FIG. 25. The portion marked with //// in FIG. 26 corresponds to the hatched portion in FIG. 27. The portion marked with //// in FIG. 28 corresponds to the hatched portion in FIG. 29. The portion marked with //// in FIG. 30 corresponds to the hatched portion in FIG. 31. The portion marked with //// in FIG. 32 corresponds to the hatched portion in FIG. 33. The portion marked with //// in FIG. 34 corresponds to the hatched portion in FIG. 35.

By using the structure of the field effect transistor according to the invention, it is possible to make a channel length sufficient to prevent a short channel effect and to decrease a time period needed for manufacturing the device.

Such a field effect transistor can be manufactured by following the method of manufacturing the field effect transistor according to the invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor formed in a hole portion provided in a main surface of a semiconductor substrate, comprising:

a first polycrystalline silicon film, which is to be a channel, located in said hole portion, extending along the depth direction in said hole portion, and including a first end portion on the side of said main surface and a second end portion on the side of a bottom of said hole portion;

a gate electrode located in said hole portion, extending along the depth direction of said hole portion and facing said first polycrystalline silicon film with a gate insulating film interposed therebetween;

a first source/drain film located on the periphery of said first polycrystalline silicon film and said gate electrode in said hole portion, extending along the depth direction of said hole portion, and electrically connected to said second end portion;

a first insulating film located in said hole portion and electrically insulating said first source/drain film from said gate electrode;

a second insulating film located in said hole portion and electrically insulating said first source/drain film from said semiconductor substrate;

a second source/drain film located above said main surface and electrically connected to said first end portion wherein said first source/drain film and said gate electrode extend above said main surface; and said first source/drain film is electrically connected to a source/drain region of another field effect transistor formed in said main surface, and said gate electrode is electrically connected to a gate electrode of said another field effect transistor, wherein the electrode of said another field effect transistor further comprises a portion of the gate electrode of said field effect transistor extending above said main surface.

2. The field effect transistor according to claim 1, wherein said second source/drain film further comprises a first high concentration source/drain region film and a low concentration source/drain region film of the same conductivity type, wherein said low concentration source/drain region film is adjacent said gate insulating film and electrically connected to said first end portion at one end thereof and is in contact with said high concentration source/drain region film at the other end thereof, a portion of said high concentration source/drain region film being located above said main surface.

3. The field effect transistor according to claim 1, wherein said gate insulating film is located on the periphery of said first polycrystalline silicon film, and said gate electrode is located on the periphery of said gate insulating film.

4. The field effect transistor according to claim 1, wherein said first source/drain film extends to a bottom surface of said hole portion and is electrically connected to said first polycrystalline silicon film therein.

5. The field effect transistor according to claim 1, wherein said first source/drain film has a first type conductivity, and said source/drain region has a second type conductivity.

6. The field effect transistor according to claim 5, wherein said first source/drain film is electrically connected to said source/drain region with a silicide film interposed therebetween.

7. The field effect transistor according to claim 5, wherein said field effect transistor and said another field effect transistor form an inverter.

8. The field effect transistor according to claim 7, which comprises a further inverter, and wherein said inverter and said further inverter form a flip-flop of an SRAM.

9. The field effect transistor according to claim 1 wherein each of the first polycrystalline silicon film, the first source/drain film and the second source/drain film are formed separately from each other, each having a defined thickness and wherein the first source/drain film and the second source/drain film comprise polycrystalline silicon films.

10. The field effect transistor of claim 1 wherein said second insulating film is disposed between said first source/drain film and said source/drain region of said another field effect transistor.

11. The field effect transistor of claim 1 wherein said electrical connection between said first source/drain film and the source/drain region of said another field effect transistor occurs at said main surface.

12. A semiconductor device comprising:

a field effect transistor formed in a hole portion provided in a main surface of a semiconductor substrate, comprising;

a first polycrystalline silicon film of a first conductivity type, which is to be a channel, located in said hole portion, extending along the depth direction in said hole portion, and including a first end portion on the side of said main surface and a second end portion on the side of a bottom of said hole portion;

a gate electrode located in said hole portion, extending along the depth direction of said hole portion and facing said first polycrystalline silicon film with a gate insulating film interposed therebetween;

a second polycrystalline silicon film of a second conductivity type different and formed separately from said first polycrystalline silicon film, which is to be a first source/drain, located on the periphery of said first polycrystalline silicon film and said gate electrode in said hole portion, extending along the depth direction of said hole portion, and electrically connected to said second end portion;

a first insulating film located in said hole portion and electrically insulating said first source/drain film from said gate electrode;

a second insulating film located in said hole portion and electrically insulating said first source/drain film from said semiconductor substrate;

a third polycrystalline silicon film of a second conductivity type different and formed separately from said first polycrystalline silicon film, which is to be a second source/drain, located above said main surface and electrically connected to said first end portion.

13. The field effect transistor according to claim 12, wherein third polycrystalline film further comprises a first high concentration source/drain region film and a low concentration source/drain region film of the same conductivity type, wherein said low concentration source/drain region film is adjacent said gate insulating film and electrically connected to said first end portion at one end thereof and is in contact with said high concentration source/drain region film at the other end thereof, a portion of said high concentration source/drain region film being located above said main surface.

14. The field effect transistor according to claim 12, wherein said gate insulating film is located on the periphery of said first polycrystalline silicon film, and said gate electrode is located on the periphery of said gate insulating film.

15. The field effect transistor according to claim 12, wherein said second polycrystalline film extends to a bottom of said hole portion and is electrically connected to said first polycrystalline silicon film therein.

16. The field effect transistor according to claim 12, wherein said second polycrystalline film and said gate electrode extend above said main surface.

17. The field effect transistor according to claim 16, wherein said second polycrystalline film is electrically connected to a source/drain region of another field effect transistor formed in said main surface, and said gate electrode is electrically connected to a gate electrode of said another field effect transistor.

18. The field effect transistor according to claim 17, wherein said source/drain region of said another field effect transistor has a first type conductivity.

19. The field effect transistor according to claim 18, wherein said second polycrystalline film is electrically connected to said source/drain region of said another field effect transistor with a silicide film interposed therebetween.

20. The field effect transistor according to claim 18, wherein said field effect transistor and said another field effect transistor form an inverter.

21. The field effect transistor according to claim 20, which comprises a further inverter, and wherein said inverter and said further inverter form a flip-flop of an SRAM.

\* \* \* \* \*